US012184276B2

(12) United States Patent
Ito et al.

(10) Patent No.: US 12,184,276 B2
(45) Date of Patent: Dec. 31, 2024

(54) INTERIOR ARTICLE FOR CONVEYANCE

(71) Applicant: TS TECH CO., LTD., Saitama (JP)

(72) Inventors: Takayoshi Ito, Tochigi (JP); Kazumasa Narita, Tochigi (JP); Akihiro Matsumoto, Tochigi (JP); Takashi Takahara, Tochigi (JP); Yuji Nishimaki, Tochigi (JP)

(73) Assignee: TS TECH CO., LTD., Saitama (JP)

( * ) Notice: Subject to any disclaimer, the term of this patent is extended or adjusted under 35 U.S.C. 154(b) by 104 days.

(21) Appl. No.: 18/013,631

(22) PCT Filed: Feb. 2, 2021

(86) PCT No.: PCT/JP2021/003790
§ 371 (c)(1),
(2) Date: Dec. 29, 2022

(87) PCT Pub. No.: WO2022/004031
PCT Pub. Date: Jan. 6, 2022

(65) Prior Publication Data
US 2023/0291403 A1    Sep. 14, 2023

Related U.S. Application Data

(60) Provisional application No. 63/047,941, filed on Jul. 3, 2020, provisional application No. 63/047,944, filed on Jul. 3, 2020.

(51) Int. Cl.
*H03K 17/96* (2006.01)
*B60N 2/02* (2006.01)
(Continued)

(52) U.S. Cl.
CPC ........... *H03K 17/962* (2013.01); *G06F 3/044* (2013.01); *B60N 2/02* (2013.01); *B60R 13/0243* (2013.01); *B60W 60/00* (2020.02)

(58) Field of Classification Search
CPC ....... B60W 60/00; B60N 2/02; B60N 2/0224; B60N 2/0228; B60N 2/0268;
(Continued)

(56) References Cited

U.S. PATENT DOCUMENTS 6,483,048 B1 * 11/2002 Bontrager ........... B60R 16/0215
296/153
2009/0077595 A1    3/2009 Sizelove et al.
(Continued)

FOREIGN PATENT DOCUMENTS

CN           105992710 A    10/2016
JP           S62-101535 A    5/1987
(Continued)

OTHER PUBLICATIONS

Extended European Search Report (EESR) dated Jan. 16, 2024 for the corresponding European Patent Application No. 21832643.7.
(Continued)

*Primary Examiner* — Anthony R Jimenez
(74) *Attorney, Agent, or Firm* — Michael Best & Friedrich LLP

(57) ABSTRACT

Provided is an interior article for a conveyance including a touch switch suppressing an unintended misoperation by an occupant. An interior article for a conveyance of the present invention includes a touch switch operating an electrical component provided in a conveyance and a recess portion formed in an interior side surface of the conveyance. The touch switch has a sensor detecting an occupant's finger. The recess portion has an opening portion, a bottom portion, a standing wall portion formed around the bottom portion, and a curved surface formed to be curved so as to protrude toward the opening portion side in the bottom portion. The sensor is disposed on the curved surface.

13 Claims, 22 Drawing Sheets

(51) Int. Cl.
    *B60R 13/02* (2006.01)
    *B60W 60/00* (2020.01)
    *G06F 3/044* (2006.01)

(58) Field of Classification Search
    CPC . B60R 13/0243; B60R 13/02; B60R 13/0239;
        H03K 17/962; G06F 3/044; G05G 1/025;
        G05G 1/06; G05G 2700/00; G05G
        2700/06; G05G 2700/08; H01H
        2003/007; H01H 2239/074; H01H
        2300/00; H01H 2300/008
    USPC .......................................................... 200/600
    See application file for complete search history.

(56) References Cited

U.S. PATENT DOCUMENTS

| | | |
|---|---|---|
| 2009/0079705 A1 | 3/2009 | Sizelove et al. |
| 2009/0083805 A1 | 3/2009 | Sizelove et al. |
| 2009/0119721 A1 | 5/2009 | Perlman et al. |
| 2011/0143835 A1 | 6/2011 | Sizelove |
| 2013/0210525 A1 | 8/2013 | Sizelove et al. |
| 2014/0322930 A1 | 10/2014 | Sizelove et al. |
| 2015/0340173 A1 | 11/2015 | Suzuki et al. |
| 2017/0015217 A1* | 1/2017 | Pike .......................... B60N 2/20 |
| 2017/0136918 A1 | 5/2017 | Gerding et al. |
| 2019/0218836 A1 | 7/2019 | Trabucco |
| 2020/0019254 A1 | 1/2020 | Tsukamoto et al. |
| 2020/0369148 A1* | 11/2020 | Bongard ................ B60K 35/00 |
| 2022/0153214 A1 | 5/2022 | Tanabe et al. |

FOREIGN PATENT DOCUMENTS

| | | |
|---|---|---|
| JP | 2008-044495 A | 2/2008 |
| JP | 2010-539815 A | 12/2010 |
| JP | 2013-166510 A | 8/2013 |
| JP | 2018-169758 A | 11/2018 |
| JP | 2019-073110 A | 5/2019 |
| JP | 2020-059438 A | 4/2020 |
| WO | 2020/184702 A1 | 9/2020 |

OTHER PUBLICATIONS

International Search Report mailed on Apr. 20, 2021 for the corresponding PCT Application No. PCT/JP2021/003790, with English machine translation.

* cited by examiner

INTERIOR ARTICLE FOR CONVEYANCE

CROSS-REFERENCE TO RELATED APPLICATIONS

This application is a National Entry application of PCT Application Serial Number PCT/JP2021/003790, filed Feb. 2, 2021. Further this application claims priority from U.S. Provisional Application No. 63/047,941, filed Jul. 3, 2020, and U.S. Provisional Application No. 63/047,944, filed Jul. 3, 2020, the entire contents of which are hereby incorporated by reference into this application.

TECHNICAL FIELD

The present invention relates to an interior article for a conveyance and, more particularly, to an interior article for a conveyance including a touch switch.

BACKGROUND ART

An interior article for a vehicle such as a vehicle door is provided with a touch switch for operating an electrical component mounted in a vehicle. For example, the armrest of a vehicle door is provided with a touch switch for operating a power window, and an occupant can open and close the window by touching the touch switch, which is an operating switch, with his or her finger (for example, Patent Literature 1).

CITATION LIST

Patent Literature

PATENT LITERATURE 1: International Publication WO 2020/184702

SUMMARY OF INVENTION

Technical Problem

However, the touch switch is planarly formed and has a physically unregulated operable range, and thus the operating occupant's finger may deviate from the operable range. In addition, in some cases, the occupant's finger inadvertently touches the sensing unit of the touch switch to result in erroneous input and electrical component operations.

The present invention has been made in view of the above problems, and an object of the present invention is to provide an interior article for a conveyance including a touch switch suppressing an unintended misoperation by an occupant.

Solution to Problem

The above object is achieved by means of an interior article for a conveyance, including: a touch switch operating an electrical component provided in a conveyance; and a recess portion formed in a side surface on an interior side of the conveyance, in which the touch switch has a sensing unit detecting an occupant's finger, the recess portion has an opening portion, a bottom portion, a standing wall portion formed around the bottom portion, and a curved surface formed in the bottom portion to be curved so as to protrude toward the opening portion side, and the sensing unit is disposed on the curved surface.

The standing wall portion of the recess portion regulates the range of an input operation by the occupant's finger, and thus the occupant's finger deviating from an operable range is suppressed. In addition, the occupant's finger inadvertently touching the sensing unit is suppressed by the presence of the standing wall portion, and thus performing an input operation by mistake is suppressed. In addition, the sensing unit is disposed on the curved surface protruding toward the opening portion side, and thus it becomes easy for the occupant to know that the sensing part is touched in using the touch switch.

In addition, in the interior article for a conveyance described above, the interior article for a conveyance may be a door lining provided on a conveyance door, and the recess portion may be formed on a side surface of the door lining on the interior side.

By forming the recess portion on the side surface of the door lining on the interior side, it is possible to suppress, for example, an occupant seated near the door coming into contact with the sensing unit of the touch switch by mistake.

In addition, in the interior article for a conveyance described above, the sensing unit may be configured from a plurality of sensor regions arranged in an up to down direction of the conveyance, and the sensor region positioned on a lower side may be disposed so as to deviate from an axis in the up to down direction of the sensor region positioned on an upper side.

In a case where a finger (thumb in particular) is used to come into contact with the touch switch while gripping a part of the interior article for a conveyance, by the sensor regions arranged in the up to down direction being misaligned, the positions thereof match the trajectory of the finger and touching can be performed with ease.

In addition, in the interior article for a conveyance described above, the sensing unit may be configured from a plurality of sensor regions arranged in an up to down direction and a front to back direction of the conveyance, and as for the lower sensor region positioned on a lower side, a front end portion of the lower sensor region may be positioned behind a front end portion of the upper sensor region positioned on an upper side, or a rear end portion of the lower sensor region may be positioned behind a rear end portion of the upper sensor region.

In a case where a finger (thumb in particular) is used to come into contact with the touch switch while gripping a part of the interior article for a conveyance, as a result of the above disposition, the position of the sensor region matches the trajectory of the finger (thumb in particular) and touching is performed with ease.

In addition, in the interior article for a conveyance described above, the sensing unit may have a first sensing unit configured from a plurality of sensor regions arranged in an up to down direction of the conveyance, and a second sensing unit disposed behind the first sensing unit in a front to back direction of the conveyance and configured from a plurality of sensor regions arranged in the up to down direction of the conveyance, and the lowermost sensor region of the first sensing unit and the uppermost sensor region of the second sensing unit may be disposed so as to overlap in the up to down direction.

In a case where a finger (thumb in particular) is used to come into contact with the touch switch while gripping a part of the interior article for a conveyance, as a result of the above disposition, the position of the sensor region matches the trajectory of the finger (thumb in particular) and touching is performed with ease.

In addition, the interior article for a conveyance described above may include a grip portion provided near the touch switch and gripped when the occupant operates the touch switch, in which the grip portion may have a grip detection unit detecting gripping performed by the occupant and a grip position specifying unit detecting a position gripped by the occupant in the grip portion, and the touch switch may change a position of the sensing unit detecting the occupant's finger in the touch switch based on the grip position of the occupant detected by the grip position specifying unit.

By the position of the sensing unit being changed based on the grip position, the sensing unit can be disposed at an easy-to-touch position by absorbing an occupant physique- or posture-attributable difference.

In addition, in the interior article for a conveyance described above, the touch switch may enable the operation of the electrical component by the touch switch in a case where the gripping of the grip portion is detected by the grip detection unit.

As a result of the above configuration, it is possible to suppress an unintended misoperation of the electrical component attributable to the occupant's inadvertent contact with the touch switch.

In addition, in the interior article for a conveyance described above, the touch switch may be capable of acquiring information on a state of a conveyance seat where the occupant sits, and the operation of the electrical component by the touch switch may be enabled in a case where the touch switch acquires information that the conveyance seat is in a relaxed state to relax the occupant.

In the case of the relaxed state, by enabling the operation of the electrical component by the touch switch, it is possible to suppress, for example, an unintended misoperation attributable to erroneous touch switch contact during driving.

In addition, in the interior article for a conveyance described above, the touch switch may enable the operation of the electrical component by the touch switch in a case where the conveyance is in an autonomous traveling state.

In a case where the conveyance is in the autonomous traveling state, by enabling the operation of the electrical component by the touch switch, it is possible to suppress an unintended misoperation attributable to erroneous touch switch contact during driving.

In addition, in the interior article for a conveyance described above, a plurality of the sensing units may be provided, and at least one of the plurality of sensing units may be a target selection sensing unit selecting the electrical component to be operated by the touch switch, and the target selection sensing unit may enable the electrical component to be operated to be changed in a case where the target selection sensing unit is long-pressed for a predetermined time by the occupant.

By the electrical component to be operated being changeable in a case where the target selection sensing unit is long-pressed, an unintended misoperation during operation target switching is suppressed.

In addition, the interior article for a conveyance described above may include a main body and an operating member having the touch switch and detachably attached to the main body, in which the touch switch may operate the electrical component by wireless communication, and the operating member may be removed by being pulled out in an up to down direction with respect to the main body of the interior article for a conveyance.

By providing the touch switch on the operating member that can be detached from the main body, in a case where, for example, an occupant is seated in the direction that is opposite to the traveling direction of the conveyance, the convenience of the touch switch can be enhanced by removing the operating member.

In addition, by the up to down direction being the removal direction, the operating member coming off the main body by mistake can be suppressed.

In addition, the interior article for a conveyance described above may include a main body and an operating member having the touch switch and rotatably attached to the main body.

By providing the touch switch on the rotatable operating member, during use, the operating surface of the touch switch can be turned in a direction that is easy for an occupant to touch. In addition, during non-use, an unintended misoperation can be suppressed by turning the operating surface of the touch switch in a direction that is difficult to touch.

Advantageous Effects of Invention

According to the present invention, the standing wall portion of the recess portion regulates the range of an input operation by the occupant's finger, and thus the occupant's finger deviating from an operable range is suppressed. In addition, the occupant's finger inadvertently touching the sensing unit is suppressed by the presence of the standing wall portion, and thus performing an input operation by mistake is suppressed. In addition, the sensing unit is disposed on the curved surface protruding toward the opening portion side, and thus it becomes easy for the occupant to know that the sensing part is touched in using the touch switch.

By forming the recess portion on the side surface of the door lining on the interior side, it is possible to suppress, for example, an occupant seated near the door coming into contact with the sensing unit of the touch switch by mistake.

In a case where a finger (thumb in particular) is used to come into contact with the touch switch while gripping a part of the interior article for a conveyance, by the sensor regions arranged in the up to down direction being misaligned, the positions thereof match the trajectory of the finger and touching can be performed with ease.

In a case where a finger (thumb in particular) is used to come into contact with the touch switch while gripping a part of the interior article for a conveyance, as a result of the above disposition, the position of the sensor region matches the trajectory of the finger (thumb in particular) and touching is performed with ease.

In a case where a finger (thumb in particular) is used to come into contact with the touch switch while gripping a part of the interior article for a conveyance, as a result of the above disposition, the position of the sensor region matches the trajectory of the finger (thumb in particular) and touching is performed with ease.

By the position of the sensing unit being changed based on the grip position, the sensing unit can be disposed at an easy-to-touch position by absorbing an occupant physique- or posture-attributable difference.

As a result of the above configuration, it is possible to suppress an unintended misoperation of the electrical component attributable to the occupant's inadvertent contact with the touch switch.

In the case of the relaxed state, by enabling the operation of the electrical component by the touch switch, it is possible to suppress, for example, an unintended misoperation attributable to erroneous touch switch contact during driving.

In a case where the conveyance is in the autonomous traveling state, by enabling the operation of the electrical component by the touch switch, it is possible to suppress an unintended misoperation attributable to erroneous touch switch contact during driving.

By the electrical component to be operated being changeable in a case where the target selection sensing unit is long-pressed, an unintended misoperation during operation target switching is suppressed.

By providing the touch switch on the operating member that can be detached from the main body, in a case where, for example, an occupant is seated in the direction that is opposite to the traveling direction of the conveyance, the convenience of the touch switch can be enhanced by removing the operating member.

In addition, by the up to down direction being the removal direction, the operating member coming off the main body by mistake can be suppressed.

By providing the touch switch on the rotatable operating member, during use, the operating surface of the touch switch can be turned in a direction that is easy for an occupant to touch. In addition, during non-use, an unintended misoperation can be suppressed by turning the operating surface of the touch switch in a direction that is difficult to touch.

DESCRIPTION OF EMBODIMENTS

<<First Embodiment: Door Lining>>

Hereinafter, the configuration of an interior article for a conveyance according to a first embodiment of the present invention will be described with reference to the drawings. However, the embodiment described below is for facilitating the understanding of the present invention and does not limit the present invention. In other words, the present invention can be modified and improved without departing from the spirit thereof, and it is a matter of course that the present invention includes equivalents thereof.

In addition, the content in the following description that is related to the materials, shapes, and sizes of the components configuring the interior article for a conveyance is merely a specific example and does not limit the present invention.

It should be noted that in the following description, a vehicle door lining provided on a door of a vehicle, a door armrest in particular, will be given as an example of the interior article for a conveyance and a configuration example thereof will be described. However, the present invention is not limited to a vehicle door lining mounted in a ground-traveling wheeled conveyance such as an automobile and a railroad vehicle and is also applicable to a vehicle door lining mounted in a non-ground conveyance such as an aircraft and a ship.

In addition, in the following description, the "front to back direction" is the front to back direction of the vehicle door and coincides with the direction in which the vehicle travels. In addition, the "door width direction" is the breadth direction of the vehicle door and coincides with the right to left direction that is viewed from a seated occupant in a seat in the vehicle. In addition, the "up to down direction" is the up to down direction of the vehicle door and, when the vehicle travels on a horizontal surface, coincides with the vertical direction. In addition, the simple mention of "outside" refers to the side that is close to the outside in the direction from the center of the single unit of the vehicle door toward the outside, and the "inside" means the side that is close to the center in the direction from the outside of the single unit of the vehicle door toward the center. In addition, the "interior side" means the direction toward the inside of the passenger compartment in a state where the vehicle door is closed.

It should be noted that unless otherwise specified, the shape, position, posture, and so on of each portion of the vehicle door described below are described assuming a state where the vehicle door is closed.

<Vehicle Door D>

Figure 1:
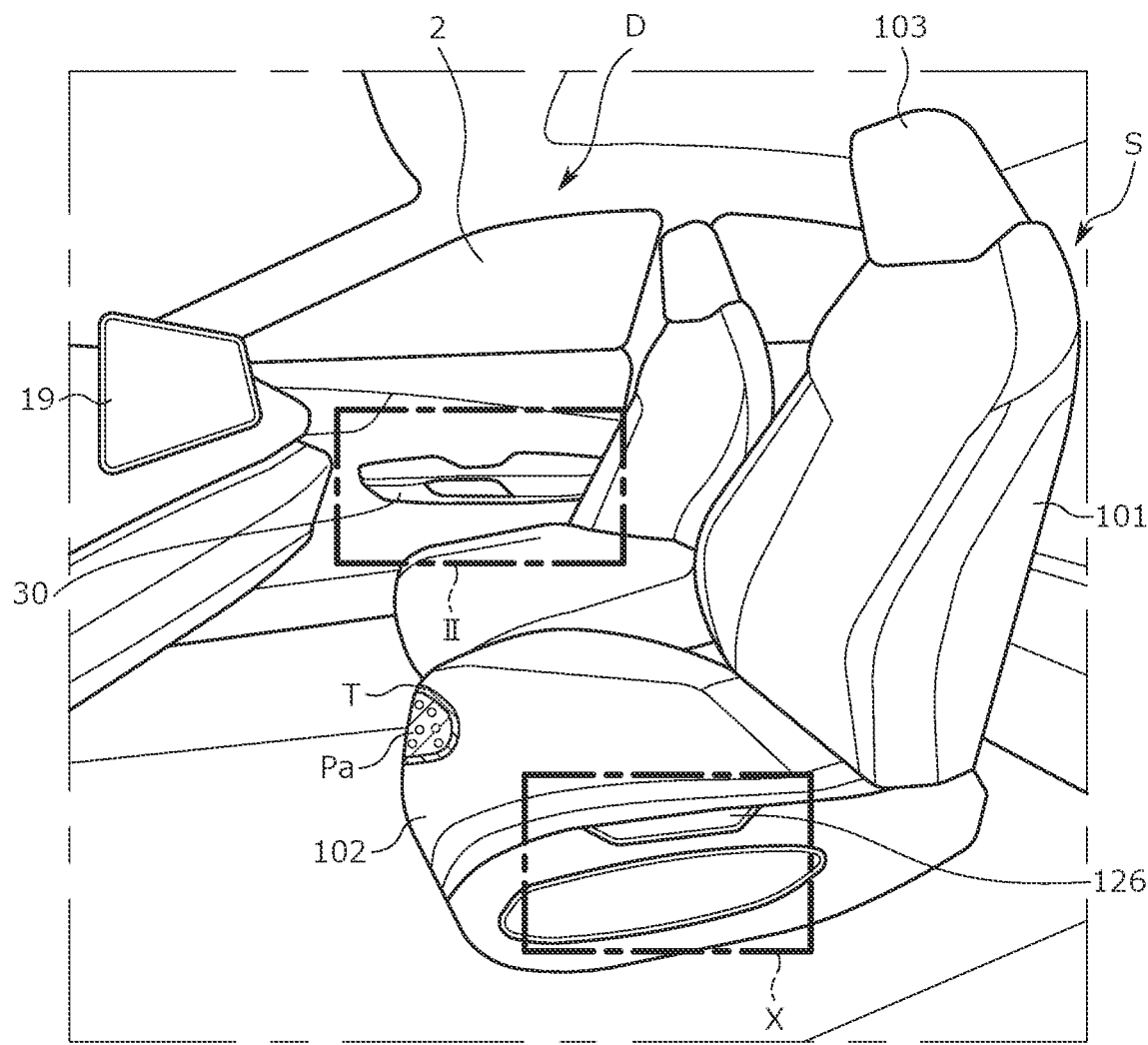
FIG. 1 is a perspective view in which the inside of a passenger compartment to which an interior article for a vehicle according to an embodiment of the present invention is attached is viewed obliquely from the front.
Figure 2:
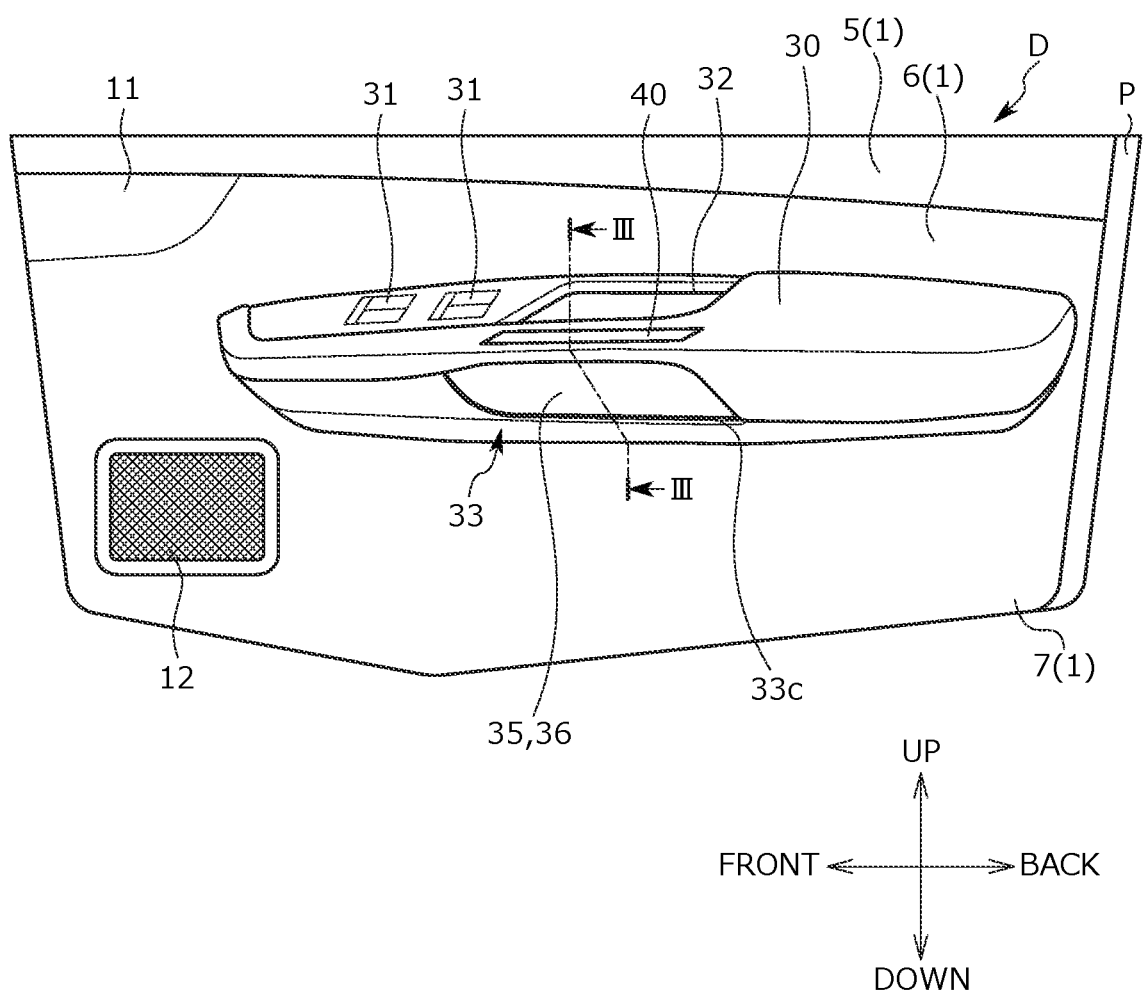
FIG. 2 is an enlarged perspective view illustrating a part II of FIG. 1 and is a side view illustrating a door lining provided on a vehicle door.

A basic configuration of a vehicle door D including the door lining according to the present embodiment will be described with reference to FIGS. 1 and 2. FIG. 1 is a perspective view illustrating the inside of a passenger compartment where the vehicle door D and a vehicle seat S are provided. FIG. 2 is a side view illustrating a door lining 1 provided on the vehicle door D.

The vehicle door D includes a door panel P, a window 2 formed on the upper portion of the door panel P, and the door lining 1 provided below the window 2 on the door panel P. The door lining 1 is configured from an upper member 5, a center member 6, a lower member 7, and a door armrest 30 provided between the center member 6 and the lower member 7 and protruding toward the inside of the passenger compartment. In addition, a door handle 11 is provided in front of the center member 6, and a door pocket (not illustrated) and a speaker 12 are provided in front of the lower member 7.

<Door Armrest 30>

Next, the door armrest 30 including a touch switch 35 for operating an in-vehicle device 13 (electrical component) provided in the vehicle will be described. The door armrest 30 is an example of the interior article for a conveyance of the present invention.

Figure 3:
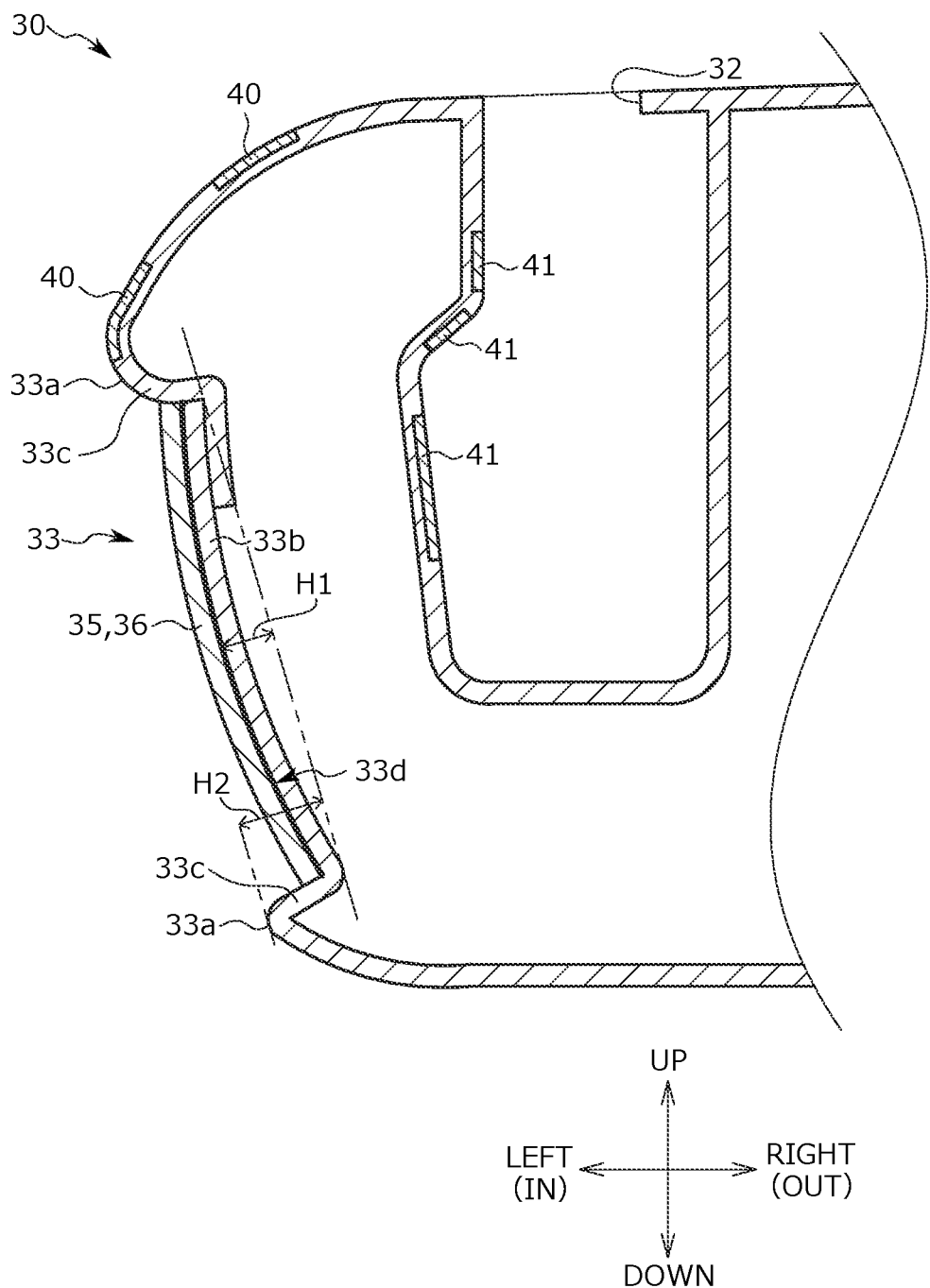
FIG. 3 is a cross-sectional view of a door armrest taken along line III-III of FIG. 2.

As illustrated in FIGS. 2 and 3, the door armrest 30 is a member protruding from the door panel P toward the interior side and is a part where the hand or arm of an occupant seated in the vehicle seat S rests. The door armrest 30 has a shape extending in the front to back direction of the door, and a door window opening-closing switch 31 for power window opening-closing operation is installed on the upper surface of the front side of the door armrest 30. In addition, a pull pocket 32 (an example of a grip portion) for the occupant to grip the door armrest 30 is formed in the middle portion of the upper surface. The occupant can grip the door armrest 30 by inserting a finger into the pull pocket 32.

In addition, as illustrated in FIG. 3, a recess portion 33 recessed to the exterior side is formed in the side surface of the door armrest 30 on the interior side. The recess portion 33 is configured from an opening portion 33a, a bottom portion 33b, and a standing wall portion 33c formed around the bottom portion 33b. In addition, the bottom portion 33b is provided with a curved surface 33d curved so as to protrude toward the opening portion side. The touch switch 35 has a plurality of sensing units 36 detecting an occupant's finger. The touch switch 35 and the sensing units 36 are disposed along the curved surface 33d of the bottom portion 33b.

It should be noted that a height H1 of the curved surface 33d is formed so as not to exceed a height H2 of the standing wall portion 33c. Therefore, although the touch switch 35 is exposed to the interior side, the touch switch 35 is surrounded by the standing wall portion 33c, and thus an occupant's arm does not abut against the touch switch 35 even if the arm inadvertently comes into contact with the side surface. More specifically, even if the occupant's arm inadvertently abuts against the side surface of the door armrest 30, the arm is supported by the standing wall portion 33c, a gap is formed between the touch switch 35 and the arm, and the arm does not directly abut against the sensing unit 36 of the touch switch 35. Therefore, an unintended misoperation can be suppressed.

In addition, in a case where the touch switch 35 is used, the range of movement of the occupant's finger can be regulated by the standing wall portion 33c. Therefore, pressing a place other than the touch switch 35 by mistake is suppressed and the input operation of the touch switch 35 can be reliably performed.

A capacitive touch sensor is used for the touch switch 35 used in the present embodiment. However, the touch switch 35 is not limited to a capacitive touch sensor and may be a resistive touch sensor, a pressure-sensitive touch sensor, or the like.

<In-Vehicle Device 13>

In addition, examples of the in-vehicle device 13 operated by the touch switch 35 include, for example, a power window device 14, an electric seat device 15, a car navigation device 16, an audio device 17, and an air conditioning device 18, and the like. The in-vehicle device 13 may include a sliding door, a sunroof, a sunshade, a lamp, and so on. The operation status of the in-vehicle device 13 is displayed on a display 19 via an ECU (control device 20).

<Electric Seat Device 15>

The electric seat device 15 has a front to back adjustment mechanism 15a, a height adjustment mechanism 15b, a reclining mechanism 15c, and a seat heater 15d. The front to back adjustment mechanism 15a is a mechanism that moves the seat in the front to back direction with respect to the vehicle body. The height adjustment mechanism 15b is a mechanism that changes the height of the seat with respect to the vehicle body. The reclining mechanism 15c is a mechanism that changes the angle of the seat back with respect to the seat cushion. The seat heater 15d is a mechanism that changes the temperature of the seat. The front to back adjustment mechanism 15a, the height adjustment mechanism 15b, and the reclining mechanism 15c include an electric motor and are driven by the electric motor. The seat heater 15d has a heating wire and changes the temperature with a supplied electric current.

<Grip Detection Sensor 40, Hand Detection Sensor 41>

In addition, a grip detection sensor 40 capable of detecting an occupant's hand is disposed in the opening portion of the pull pocket 32 so as to extend in the front to back direction. In addition, the inner wall portion of the pull pocket 32 is provided with a hand detection sensor 41 capable of detecting the occupant's finger inserted in the pull pocket 32. The grip detection sensor 40 and the hand detection sensor 41 are capacitive touch sensors and are capable of performing the detection by the occupant's hand coming into contact.

<Control Device 20>

Figure 4:
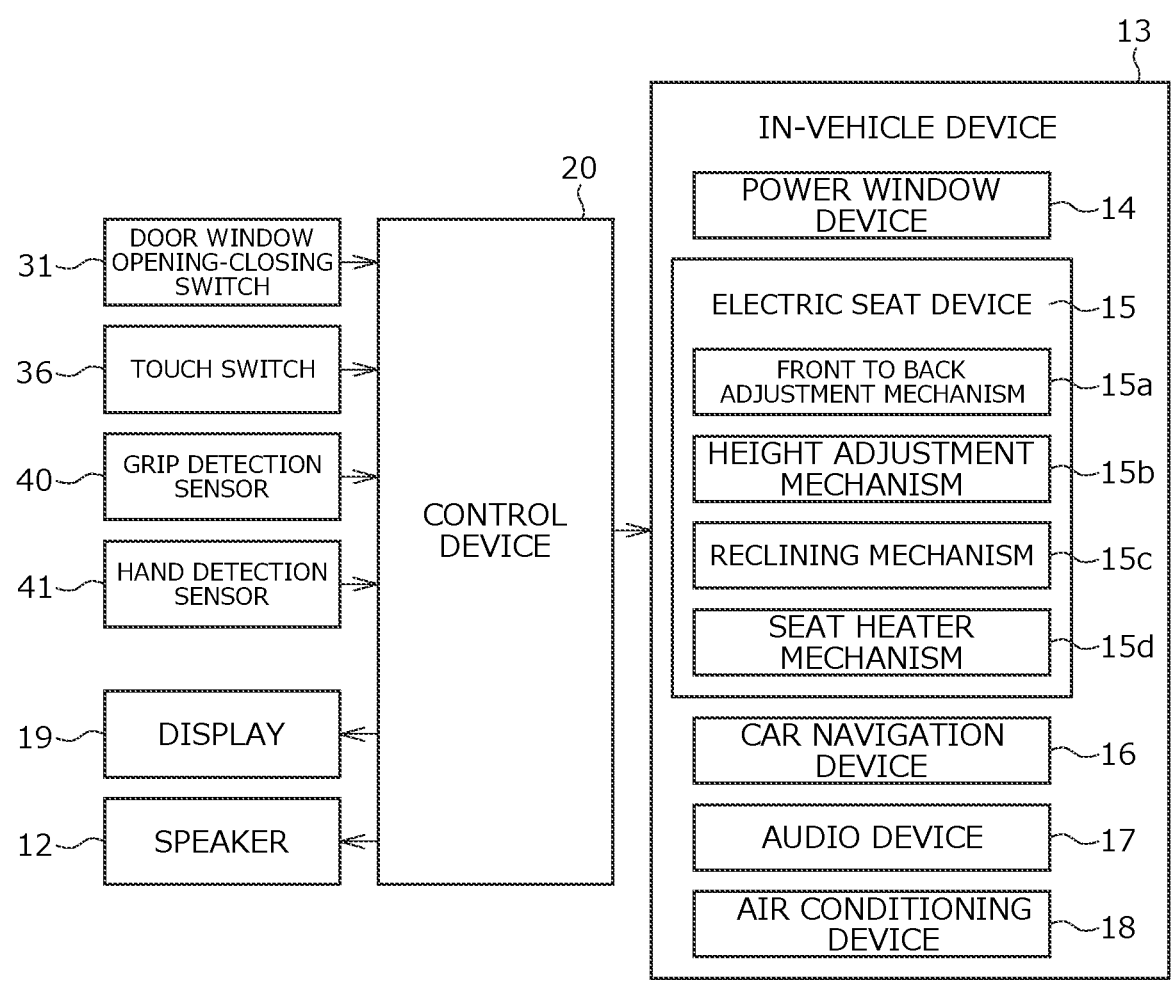
FIG. 4 is a configuration diagram of an in-vehicle device or the like operated by a touch panel of the interior article for a vehicle.

As illustrated in FIG. 4, each of the door window opening-closing switch 31, the touch switch 35, the grip detection sensor 40, and the hand detection sensor 41 is connected to the ECU (control device 20). In addition, the in-vehicle device 13 such as the power window device 14, the display 19, and the speaker 12 are also connected to the ECU and controlled by the ECU. The ECU has a CPU, a ROM, and a RAM, which are not illustrated, and the CPU executes various processing operations in accordance with a control program stored in the ROM. For example, by receiving an opening-closing signal from the door window opening-closing switch 31 and the touch switch 35, the CPU drives the electric motor of the power window device 14 to perform window opening-closing.

<Sensing Unit 36>

Figure 5A:
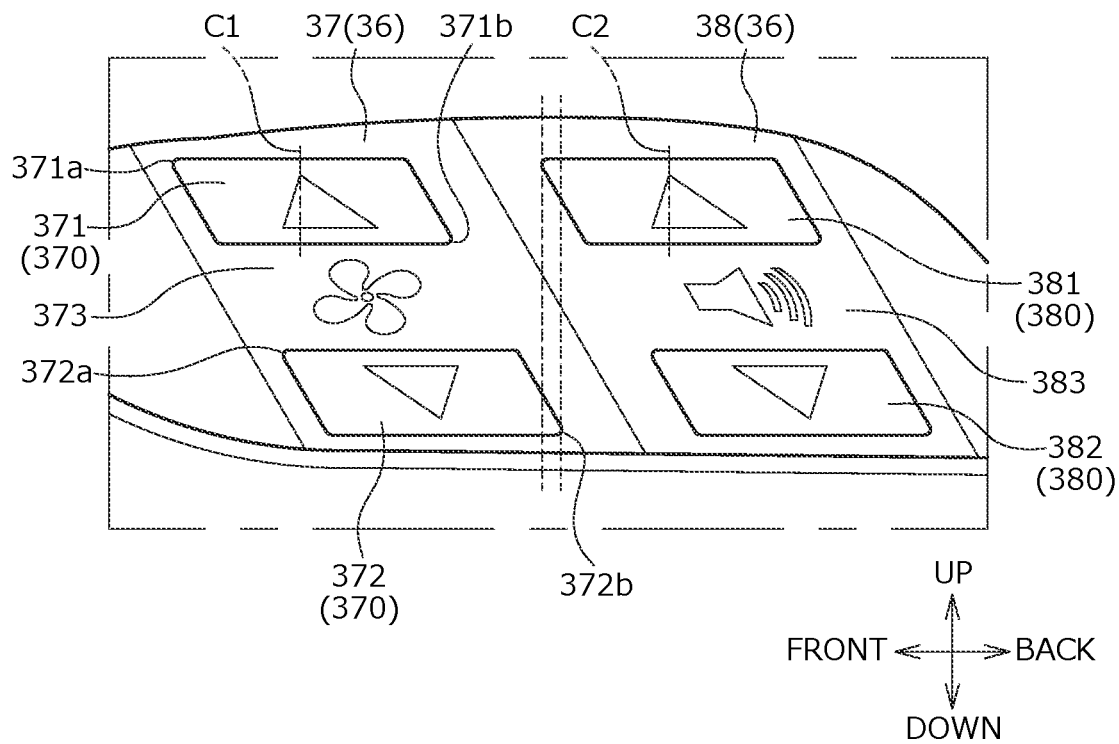
FIG. 5A is a diagram illustrating a sensing unit displayed on a touch switch of the door armrest.

FIG. 5A illustrates an example of the sensing unit 36 included in the touch switch 35. The sensing unit 36 has a first sensing unit 37 and a second sensing unit 38 disposed behind the first sensing unit 37. The first sensing unit 37 and the second sensing unit 38 are capable of operating different in-vehicle devices 13. In the example illustrated in FIG. 5A, the first sensing unit 37 is capable of operating the air volume of the air conditioning device, and the second sensing unit 38 is capable of operating the sound volume of the audio device 17. The in-vehicle device 13 that is operable can be changed by setting, and icons displayed on display units 373 and 383 can be used to distinguish which device is currently operable.

It should be noted that when an occupant touches the sensing unit 36 with a finger, the contact state or operation state is displayed on the display 19 via the ECU. In addition, when the sensing unit 36 is touched, a contact sound or an operation sound may be output from the speaker 12. The contact sound or the operation sound may vary with the content of the operation performed by the sensing unit 36. In addition, the touch switch 35 may vibrate when the sensing unit 36 is touched. The vibration may vary with the operation content of the sensing unit 36.

The first sensing unit 37 is configured from a plurality of sensor regions 370 (upper sensor region 371, lower sensor region 372, hereinafter, collectively referred to as sensor region 370 in some cases) arranged in the up to down direction. By an occupant touching the upper sensor region 371 with his or her thumb, a signal is transmitted to the control device 20 to increase the air volume. In addition, by an occupant touching the lower sensor region 372 with his or her thumb, a signal is transmitted to the control device 20 to reduce the air volume.

The second sensing unit 38 is also configured from a plurality of sensor regions 380 (upper sensor region 381, lower sensor region 382) arranged in the up to down direction. By an occupant touching the upper sensor region 381 with his or her thumb, a signal is transmitted to the control device 20 to increase the sound volume. In addition, by an occupant touching the lower sensor region 382 with his or her thumb, a signal is transmitted to the control device 20 to reduce the sound volume.

As illustrated in FIG. 5A, each of the sensor regions 370 and 380 is formed in the shape of a parallelogram. In addition, the lower sensor regions 372 and 382 are disposed so as to deviate from axes C1 and C2 of the upper sensor regions 371 and 381 in the up to down direction. In other words, a front end portion 372a of the lower sensor region 372 is positioned behind a front end portion 371a of the upper sensor region 371. In addition, a rear end portion 371b of the lower sensor region 372 is positioned behind a rear end portion 372b of the upper sensor region 371. In addition, the lower sensor region 372 of the first sensing unit and the upper sensor region 381 of the second sensing unit are disposed so as to overlap in the up to down direction.

By disposing the sensor regions in this manner, in a case where an occupant's thumb comes into contact with the sensor regions 370 and 380 with the occupant gripping the grip portion with his or her hand, the thumb can be aligned with the trajectory of movement upward and downward and the sensor regions 370 and 380 can be touched more easily.

The first sensing unit 37 and the second sensing unit 38 provided on the touch switch 35 may enable the operation of the in-vehicle device 13 in a case where an occupant's finger is detected by the grip detection sensor 40 or the hand detection sensor 41. Such control is executed by the control device 20. By controlling the touch switch 35 in this manner, operation is possible only in a case where an occupant puts his or her hand into the pull pocket 32 and grips and the occupant unintentionally misoperating can be suppressed.

In addition, the touch switch 35 is capable of acquiring the state of the electric seat device 15 where the occupant is seated and may set whether or not the touch switch 35 functions depending on the state of the electric seat device 15. For example, the operation of the in-vehicle device 13 by the touch switch 35 may be enabled only in a case where the seat back of the electric seat device 15 is tilted by a predetermined angle or more by the reclining mechanism 15c, that is, a case where information that the occupant is relaxed by the electric seat device 15 in a relaxed state is received from the control device 20. In addition, in a case where the vehicle equipped with the touch switch 35 is capable of autonomous driving, setting may be performed such that the touch switch 35 functions in the case of traveling in the autonomous driving mode.

Such control is executed by the control device 20. By making the touch switch 35 operable in a case where the electric seat device 15 is in the relaxed state or in the case of traveling in the autonomous driving mode, the occupant's finger touching the touch switch 35 by mistake during driving to cause a misoperation of the in-vehicle device 13 can be suppressed.

<Sensing Unit 36A>

Figure 5B:
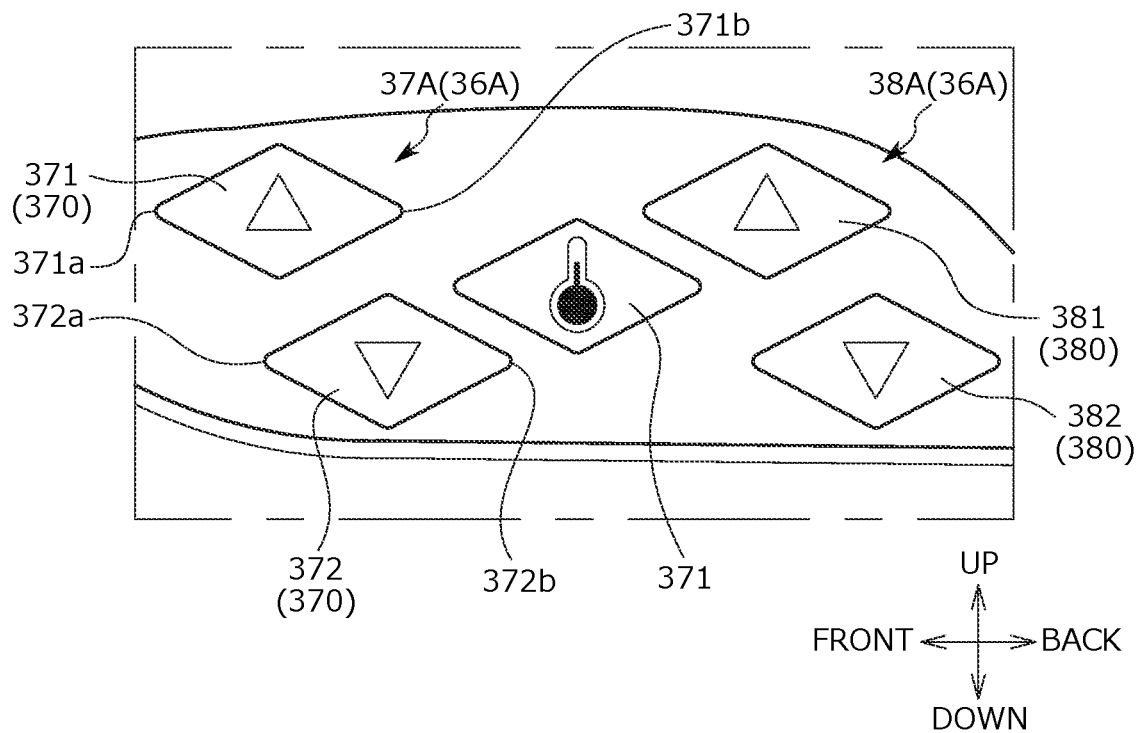
FIG. 5B is a diagram illustrating another example of the sensing unit displayed on the touch switch of the door armrest.

FIG. 5B illustrates a sensing unit 36A, which is another example. As in the case of the sensing unit 36, the sensing unit 36A has a first sensing unit 37A and a second sensing unit 38A disposed behind the first sensing unit 37A. The first sensing unit 37A is capable of operating the in-vehicle device 13. Meanwhile, the second sensing unit 38A is a target selection sensing unit capable of switching the in-vehicle device 13 that is operated by the first sensing unit 37A.

The second sensing unit 38A is capable of changing the in-vehicle device 13 that can be operated by the first sensing unit 37A in a case where the second sensing unit 38A is long-pressed by an occupant for a predetermined time, for example, one second or more. As a result of the switching in the case of long pressing, switching of the in-vehicle device 13 unintended by the occupant can be suppressed.

As illustrated in FIG. 5B, each of the sensor regions 370 and 380 of the sensing unit 36 is formed in a rhombic shape.

In addition, the lower sensor regions 372 and 382 are disposed so as to deviate from the axes of the upper sensor regions 371 and 381 in the up to down direction. In other words, the front end portion 372a of the lower sensor region 372 is positioned behind the front end portion 371a of the upper sensor region 371. In addition, the rear end portion 372b of the lower sensor region 372 may be disposed so as to be positioned behind the rear end portion 371b of the upper sensor region 371.

<Door Armrest 30B>

Figure 6A:
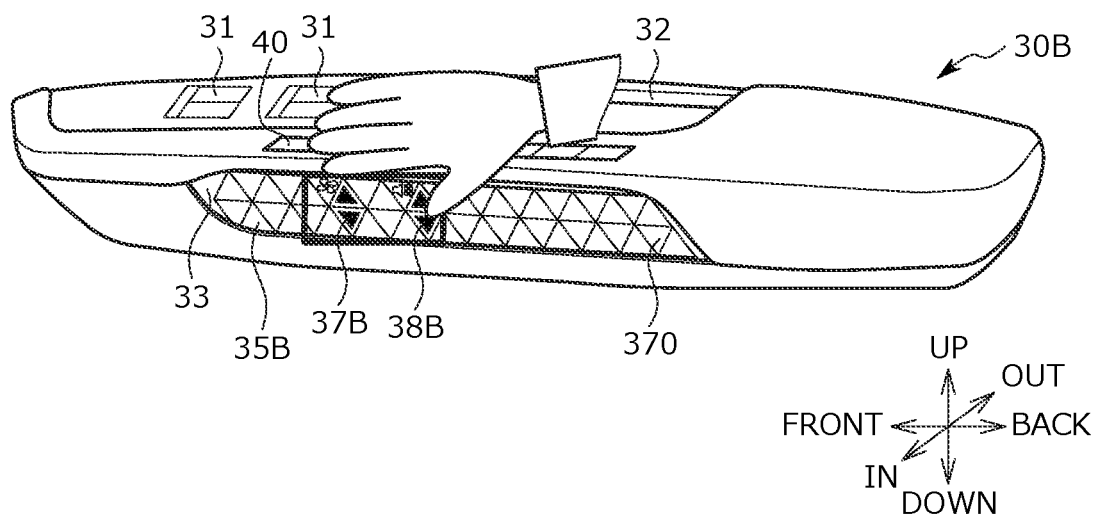
FIG. 6A is an explanatory diagram illustrating a touch switch in which the position of a sensing unit changes and illustrates a state where the sensing unit is at the front.
Figure 6B:
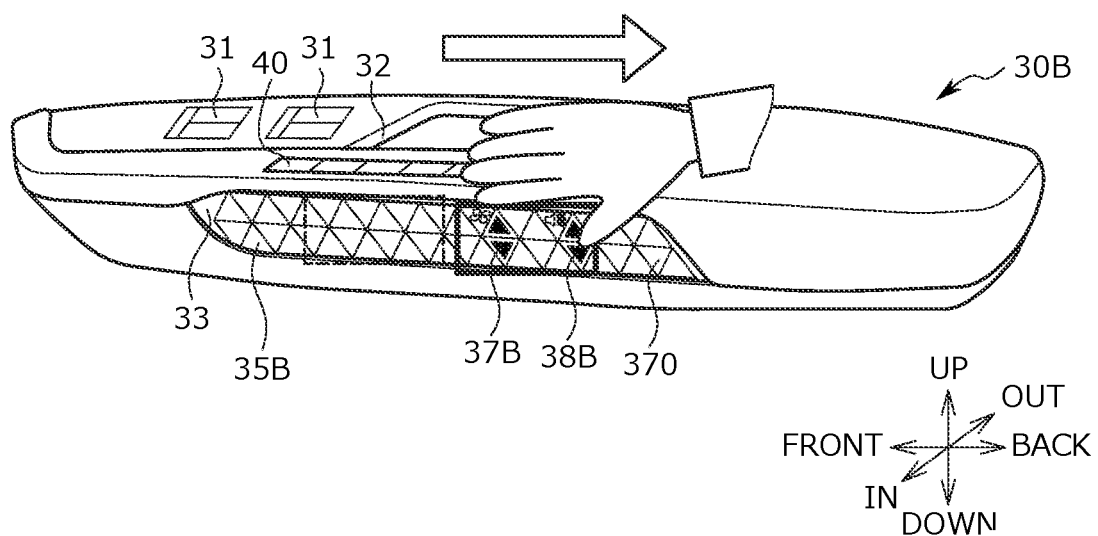
FIG. 6B is an explanatory diagram illustrating the touch switch in which the position of the sensing unit changes and illustrates a state where the sensing unit has moved to the back.

FIGS. 6A and 6B illustrate a door armrest 30B, which is another example. As in the case of the door armrest 30 illustrated in FIG. 2, as for the door armrest 30B, the door window opening-closing switch 31 is provided at the front part, the pull pocket 32 is formed on the upper surface of the middle part, the recess portion 33 is formed on the side surface on the interior side, and a touch switch 35B is provided therein.

As compared with the door armrest 30 of FIG. 2, the pull pocket 32 and the touch switch 35B are formed longer in the front to back direction thereof.

A plurality of the grip detection sensors 40 (grip position specifying units) are disposed in the opening portion of the pull pocket 32 so as to extend in the front to back direction, and the position gripped by an occupant can be detected. In addition, the inner wall portion of the pull pocket 32 is provided with the hand detection sensor 41 capable of detecting the occupant's finger inserted in the pull pocket 32.

The plurality of sensor regions 370 of the touch switch 35B are disposed side by side in the front to back direction.

The sensor region 370 can be a first sensing unit 37B or a second sensing unit 38B based on information on the position gripped by the occupant detected by the grip detection sensor 40. In other words, the positions of the first sensing unit 37B and the second sensing unit 38B can be changed in the front to back direction based on the position gripped by the occupant.

By the positions of the first sensing unit 37B and the second sensing unit 38B being changeable based on the grip position, the first sensing unit 37B and the second sensing unit 38B can be disposed at easy-to-touch positions by absorbing an occupant physique- or posture-attributable difference.

In addition, the state of the electric seat device may be monitored and the positions of the first sensing unit 37B and the second sensing unit 38B may be changed in accordance with the angle at which the seat back is inclined with respect to the seat cushion. In addition, a change in function may be performed, for example, the in-vehicle device 13 operated by the first sensing unit 37B and the second sensing unit 38B may be changed as the positions of the first sensing unit 37B and the second sensing unit 38B are changed.

<Detachable Touch Switch 35C>

Figure 7:
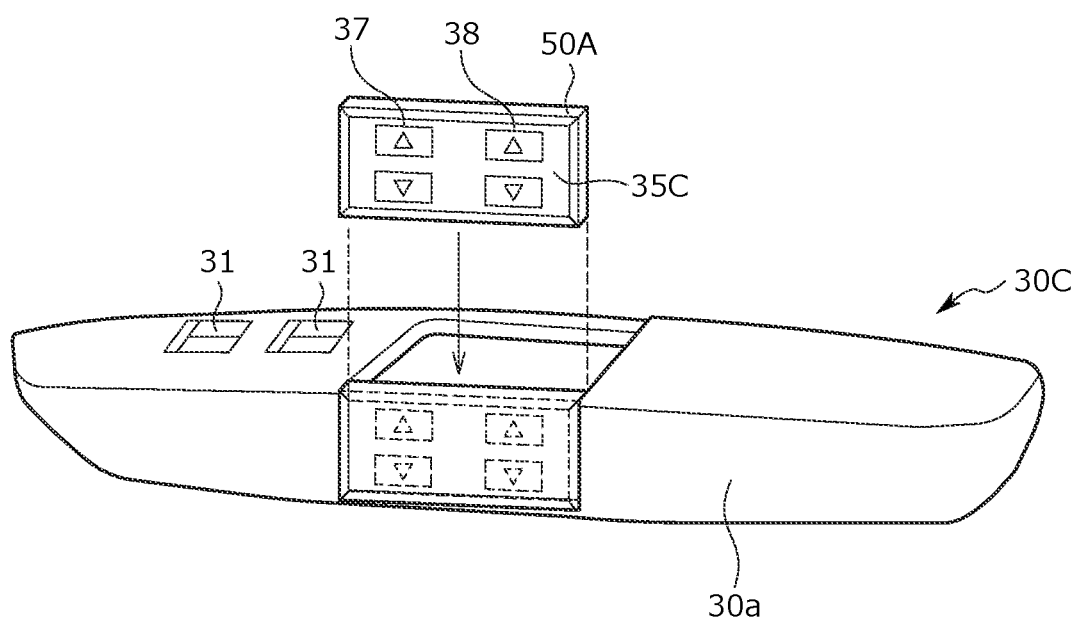
FIG. 7 is an explanatory diagram illustrating a door armrest including an operating member having a touch switch, which is detachably provided.

As illustrated in FIG. 7, an operating member 50A detachable from a door armrest main body 30a may be provided with a touch switch 35C. For example, in a case where an occupant is seated in the direction that is opposite to the traveling direction of the conveyance, the operating member 50A can be removed and operated and thus the convenience of the touch switch 35C is improved.

The operating member 50A is equipped with a wireless communication device such as a Bluetooth (registered trademark) unit such that the touch switch 35C and the control device 20 are capable of wirelessly communicating with each other. In addition, it is preferable that the operating member 50A can be removed by being pulled out in the up to down direction with respect to the main body 30a of a door armrest 30C. By limiting the removal direction to the up to down direction, inadvertently coming off the main body 30a of the door armrest can be suppressed.

The door armrest main body 30a has a charging function and is capable of charging the operating member 50A. A charging terminal may be provided and, in addition, the charging may be performed by wireless power supply or the like.

The first sensing unit 37 and the second sensing unit 38 are disposed at positions that avoid the attachment portion of the operating member 50A, the charging terminal, or the like. As a result, an increase in thickness is suppressed and the operating member 50A can be made thinner.

In addition, the operating member 50A that is removed may be attachable to the armrest of the seat.

<Rotatable Touch Switch 35D>

Figure 8:
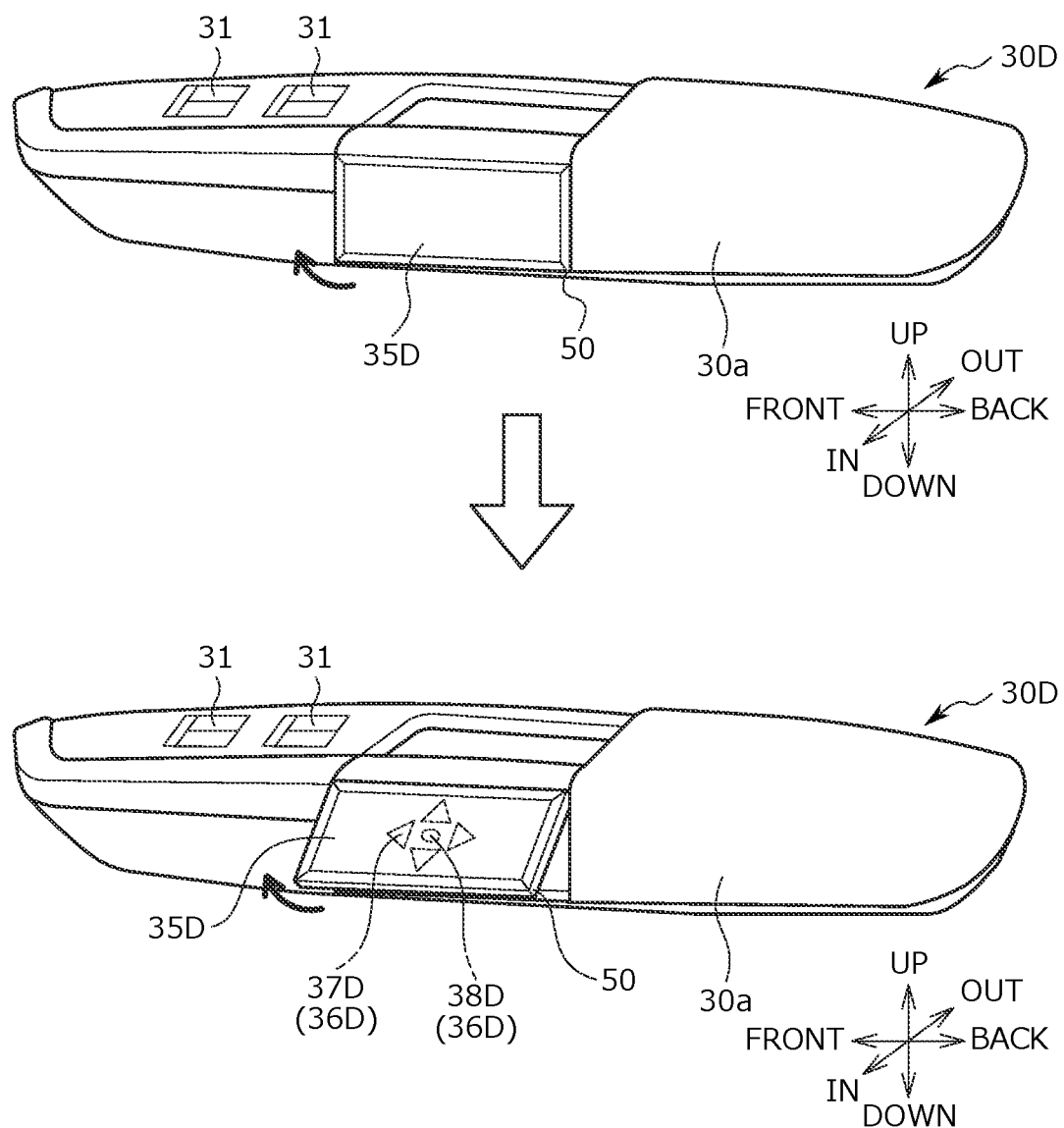
FIG. 8 is an explanatory diagram illustrating a door armrest including an operating member having a touch switch, which is rotatably provided.

As illustrated in FIG. 8, an operating member 50B rotatable with respect to the door armrest main body 30a may be provided with a touch switch 35D. When the operating member 50B is rotated by an occupant, a sensing unit 36D may be displayed on the operating surface as illustrated in FIG. 8. It should be noted that a cross key is displayed as a first sensing unit 37D and an enter key is set as a second sensing unit 38D.

In using the touch switch 35D, an occupant can turn the operating surface of the touch switch 35D in a direction that is easy to see or touch. In addition, when the touch switch 35D is not used, an unintended misoperation can be suppressed by turning the operating surface of the touch switch in a direction that is difficult to touch.

It should be noted that although the door lining 1 of the first embodiment is provided on the front-seat vehicle door D, the present invention is not limited thereto and the door lining 1 may be a door armrest provided on a rear-seat door. By providing a touch switch on the side portion of the door armrest that is provided on the rear-seat door, a rear-seat occupant can operate the touch switch with his or her thumb while gripping the door armrest.

<<Second Embodiment: Conveyance Seat>>

Hereinafter, the configuration of a conveyance seat according to a second embodiment of the present invention will be described with reference to the drawings. The content in the following description that is related to the materials, shapes, and sizes of the components configuring the conveyance seat is merely a specific example and does not limit the present invention.

It should be noted that in the following description, a vehicle seat mounted in a vehicle will be given as an example of the conveyance seat and a configuration example thereof will be described. However, the present invention is not limited to a vehicle seat mounted in a ground-traveling wheeled conveyance such as an automobile and a railroad vehicle and is also applicable to a vehicle seat mounted in a non-ground conveyance such as an aircraft and a ship.

In addition, in the following description, the "front to back direction" is the front to back direction of the vehicle seat and coincides with the direction in which the vehicle travels. In addition, the "seat width direction" is the breadth direction of the vehicle seat and coincides with the right to left direction that is viewed from a seated occupant in the vehicle seat. In addition, the "up to down direction" is the up to down direction of the vehicle seat and, when the vehicle travels on a horizontal surface, coincides with the vertical direction. In addition, the simple mention of "outside" refers to the side that is close to the outside in the direction from the center of the single unit of the vehicle seat toward the outside, and the "inside" means the side that is close to the center in the direction from the outside of the single unit of the vehicle seat toward the center.

It should be noted that unless otherwise specified, the shape, position, posture, and so on of each portion of the vehicle seat described below are described assuming that the vehicle seat is in a state where it is possible to sit.

<Vehicle Seat S>

As illustrated in FIG. 1, the vehicle seat S is a seat that is placed on the floor of the body of a vehicle and where a vehicle occupant sits. In addition, the vehicle seat S corresponds to the electric seat device 15 of the first embodiment. In the present embodiment, the vehicle seat S is used as a front seat corresponding to a vehicle front seat. However, the present invention is not limited thereto. The vehicle seat S can also be used as a rear seat. In addition, the vehicle seat S can be used as a second-row middle seat or a third-row rear seat in a vehicle that has three rows of seats in the front to back direction.

As illustrated in FIG. 1, the main components of the vehicle seat S are a seat back 101 as a backrest part supporting a seated occupant's back, a seat cushion 102 as a seating part supporting the seated occupant's buttocks, and a headrest 103 disposed on the upper portion of the seat back 101 and supporting the seated occupant's head. The seat back 101 and the seat cushion 102 are connected so as to sandwich a reclining mechanism 107 (see FIG. 9). The seat back 101 is connected to be angle-adjustable by rotating with respect to the seat cushion 102. The reclining mechanism 107 adjusts the inclination angle of the seat back 101. In addition, the seat cushion 102 includes a height adjustment mechanism (not illustrated).

<Seat Frame F>

Figure 9:
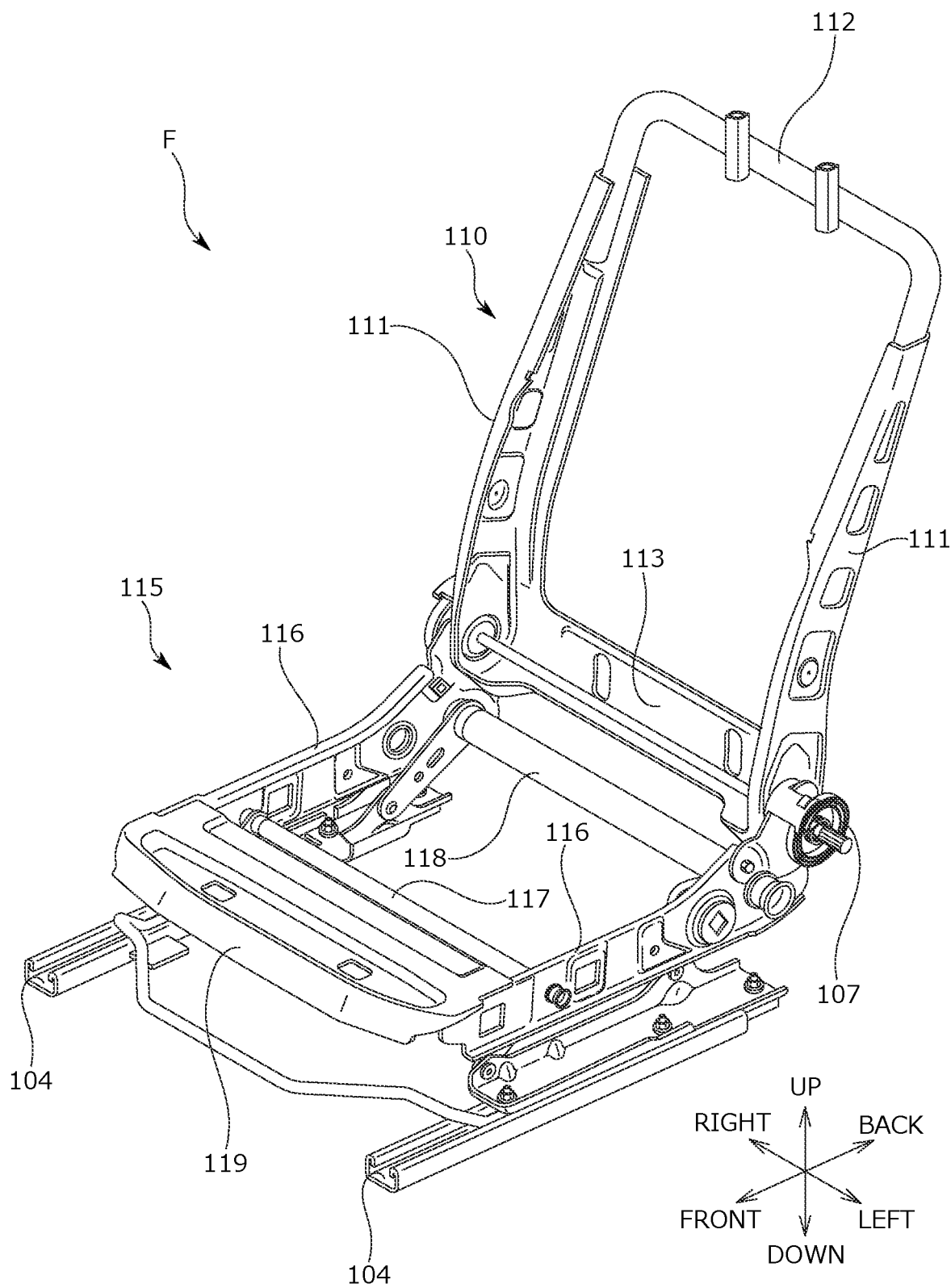
FIG. 9 is a perspective view illustrating the seat frame of a vehicle seat.

As illustrated in FIG. 9, a seat frame F is provided in the vehicle seat S, and the seat frame F is configured from a seat back frame 110 forming the skeleton of the seat back 101 and a seat cushion frame 115 forming the skeleton of the seat cushion 102.

<Seat Back Frame 110>

As illustrated in FIG. 9, the seat back frame 110 is formed in a quadrangular frame shape as a whole, and the seat back frame 110 includes a pair of back side frames 111 disposed on both sides, an upper frame 112, and a lower frame 113. The upper frame 112 is disposed between the pair of back side frames 111 and connects the upper ends of the back side frames 111. The lower frame 113 is disposed between the pair of back side frames 111 and connects the lower ends of the pair of back side frames 111.

<Seat Cushion Frame 115>

The seat cushion frame 115 is formed in a quadrangular frame shape and has side portions provided with cushion side frames 116. In addition, the seat cushion frame 115 has a front connection frame 117 connecting the cushion side frames 116 at the front and a rear connection frame 118 connecting the cushion side frames 116 at the rear. The front connection frame 117 and the rear connection frame 118 at the front and rear of the vehicle seat S are configured by round pipes. In addition, a cushion pan frame 119 is provided in front of the front connection frame 117. It should be noted that although not illustrated, a pressure receiving member is attached to bridge the cushion pan frame 119 and the rear connection frame 118 and the seated occupant's buttocks are supported from below by the pressure receiving member.

<Pad Pa and Cushion Trim Cover T>

The seat back 101 and the seat cushion 102 are configured by providing a pad Pa (pad portion) and a cushion trim cover T (cushion cover) outside the seat back frame 110 and the seat cushion frame 115. The pad Pa is a urethane base material molded by foam molding using, for example, a urethane foam material. The cushion trim cover T is made of a skin material such as cloth, synthetic leather, and genuine leather.

<Slide Rail 104>

In addition, slide rails 104 are installed below the vehicle seat S as illustrated in FIG. 2. By these slide rails 104, the vehicle seat S is attached to the vehicle body floor in a state of being slidable in the front to back direction. The slide rails 104 are provided with an electric motor (not illustrated). The vehicle seat S can be moved forward and backward by driving the electric motor.

The slide rail 104 is a device for sliding the vehicle seat S along the front to back direction and has a known structure (structure of a general slide rail mechanism). The slide rail 104 has a lower rail fixed on the vehicle body floor and an upper rail slidable with respect to the lower rail. The upper rail is slidable with respect to the lower rail fixed to the vehicle body. It should be noted that the slide rail 104 corresponds to the front to back adjustment mechanism 15a of the first embodiment.

<Reclining Mechanism 107>

The reclining mechanism 107 is provided between the lower end portion of the seat back 101 and the rear end portion of the seat cushion 102. More specifically, the reclining mechanism 107 connects the seat back frame 110 of the seat back 101 and the seat cushion frame 115 of the seat cushion 102. By the reclining mechanism 107, the angle of the seat back 101 (seat back frame 110) with respect to the seat cushion 102 (seat cushion frame 115) can be adjusted. By the reclining mechanism 107, the seat back 101 can be locked at a predetermined angle and maintained in an inclined state. In addition, by releasing the lock, the seat back 101 can be laid down forward or backward. It should be noted that the reclining mechanism 107 is provided with an electric motor and the inclination angle of the seat back 101 can be changed by driving the electric motor. In addition, the inclination angle is transmitted to the control device 20 and reflected in the setting of the touch switch 35 provided on the door armrest 30 described above or the like. It should be noted that this reclining mechanism 107 corresponds to the reclining mechanism 15c of the first embodiment.

Hereinafter, a touch switch 126 included in the vehicle seat S of the present embodiment will be described with reference to the drawings.

Figure 10:
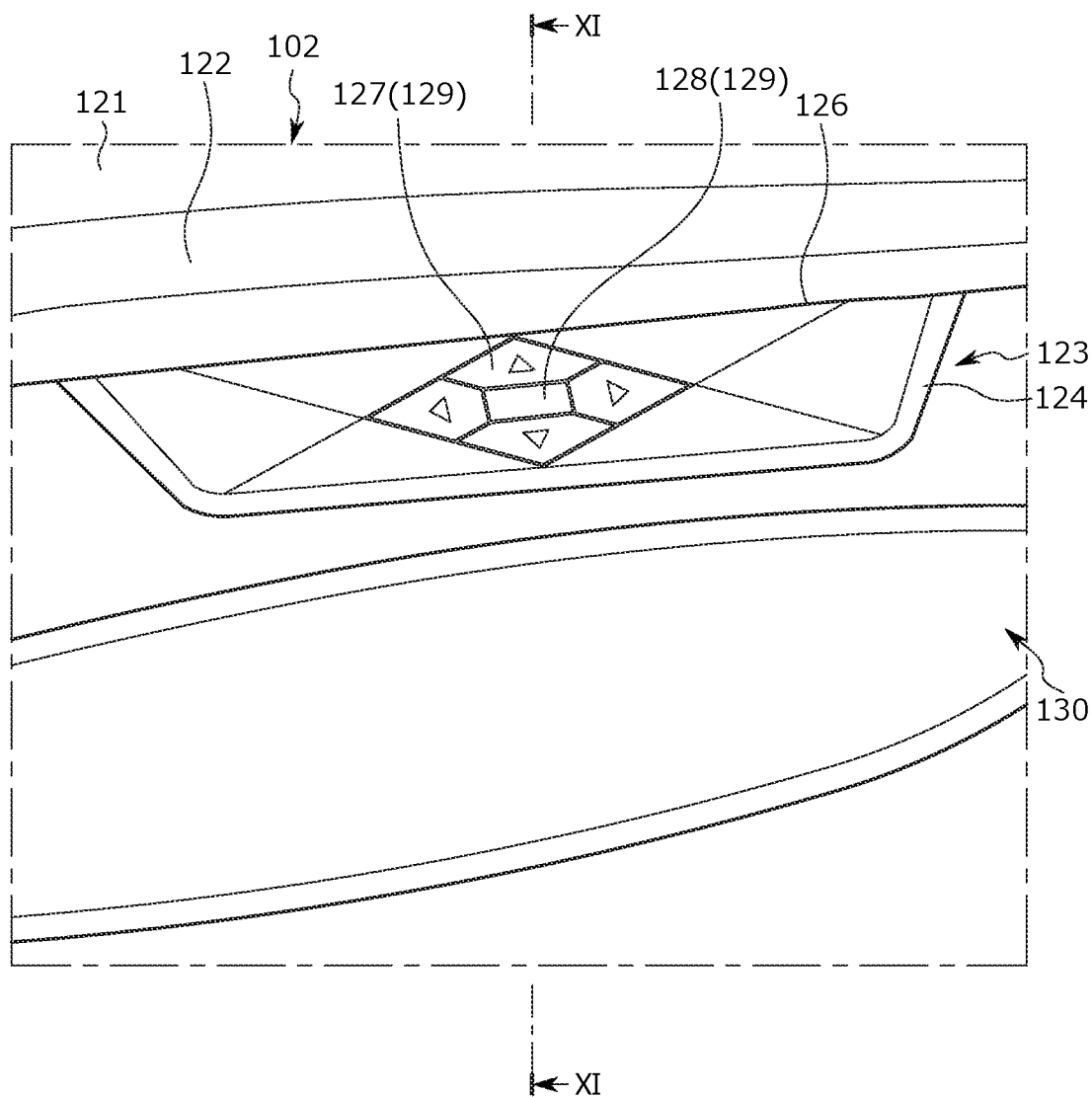
FIG. 10 is an enlarged view illustrating a part X of FIG. 1 and is a perspective view illustrating a touch switch provided on the vehicle seat.

As in the case of the touch switch 35 of the first embodiment, the touch switch 126 of the vehicle seat S is a switch for operating the in-vehicle device 13 (electrical component) provided in the vehicle. The touch switch 126 is provided on the seat cushion 102 as illustrated in FIGS. 1 and 10.

The seat cushion 102 has a seating portion 121 formed as a seating surface in an occupant sitting and a bank portion 122 disposed on the outer side portion of the seating portion 121 in the seat width direction. The upper surface of the bank portion 122 protrudes upward beyond the seating surface of the seating portion. Further, a side cover 123 that covers the seat cushion frame 115 (cushion side frame 116 to be more specific) is provided on the outside of the bank portion in the seat width direction.

In the bank portion 122, the touch switch 126 is disposed on the outside of the side close to the door in the seat width direction. The touch switch 126 may be disposed on the outside of the side far from the door (side close to the center).

In addition, the front end of the touch switch 126 is disposed at a position 90 mm to 110 mm, preferably 100 mm, behind the front end of the seat cushion. By being separated from the front end of the seat cushion, the switch can be disposed at a position that is easy for a seated occupant to operate.

Figure 11:
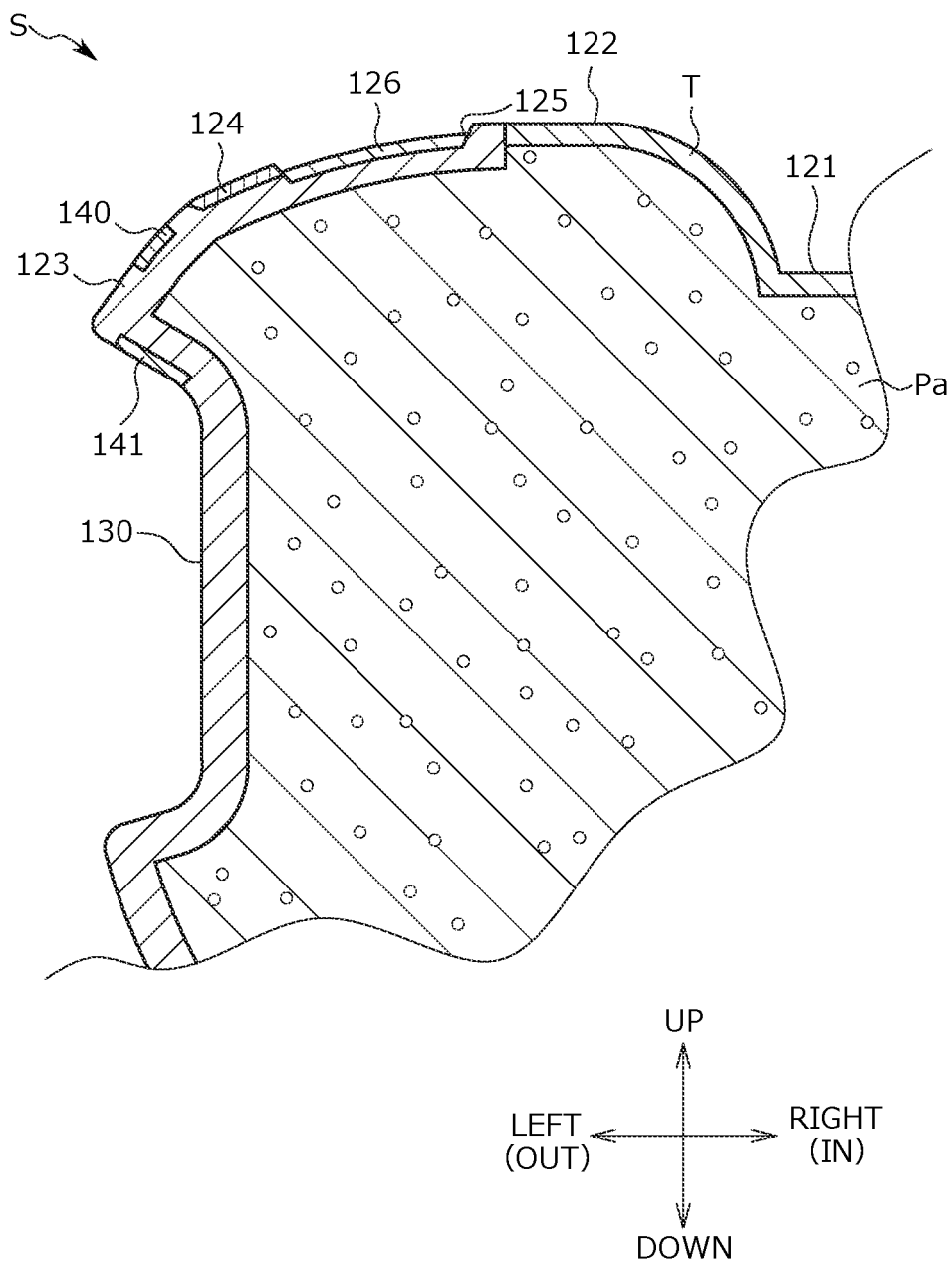
FIG. 11 is a cross-sectional view taken along line XI-XI of FIG. 10.

The touch switch 126 is disposed below the upper end of the bank portion 122 as illustrated in FIG. 11. In addition, a recess portion 125 recessed downward is formed outside in the seat width direction, and the touch switch 126 is disposed in the recess portion 125. A standing wall portion is formed around the bottom portion of the recess portion 125. Therefore, an occupant's finger touching the touch switch 126 by mistake is suppressed. The recess portion 125 is formed in the upper surface of the side cover 123 as illustrated in FIG. 11. The bottom portion of the recess portion 125 has a curved surface that is curved so as to protrude toward the opening portion of the recess portion 125, and the touch switch 126 (first sensing unit 127 and second sensing unit 128 to be more specific) may be disposed along the curved surface. In addition, a decorative frame member 124 is provided around the recess portion 125. By providing the touch switch 126 in the recess portion 125 or providing the decorative frame member 124 therearound, an occupant's finger inadvertently touching the touch switch 126 is suppressed, and an erroneous input operation is suppressed.

As illustrated in FIG. 10, the touch switch 126 is configured from the first sensing unit 127 serving as a cross key switch with sensor regions 129 arranged at the front, back, right, and left and the second sensing unit 128 where a middle sensor region 129 serves as an enter key switch.

The side cover 123 has a side surface formed with a recessed part 130 recessed inward in the seat width direction. The standing wall portion of the recessed part 130 is provided with a grip detection sensor 141.

In addition, a grip position detection sensor 140 is provided between the decorative frame member 124 and the recessed part 130. An occupant can operate the touch switch 126 with his or her thumb while gripping the standing wall portion of the recessed part 130. The position or state of the gripping can be detected by the grip detection sensor 141 and the grip position detection sensor 140.

Figure 12:
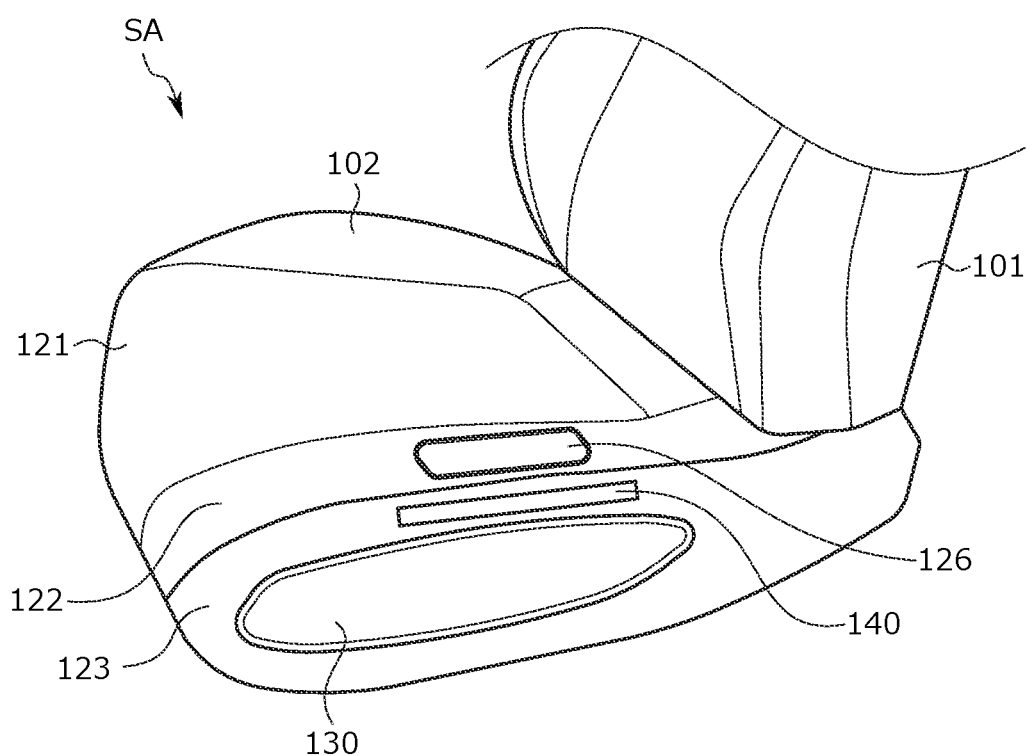
FIG. 12 is a perspective view illustrating another example of the touch switch provided on the vehicle seat.

The touch switch 126 may be directly attached to the bank portion 122 as in a conveyance seat SA in FIG. 12. The outer peripheral portion of the touch switch 126 is bound to the skin material (cushion trim cover T) of the bank portion 122 by sewing or the like.

<Position-Changeable Touch Switch 126B>

Figure 13:
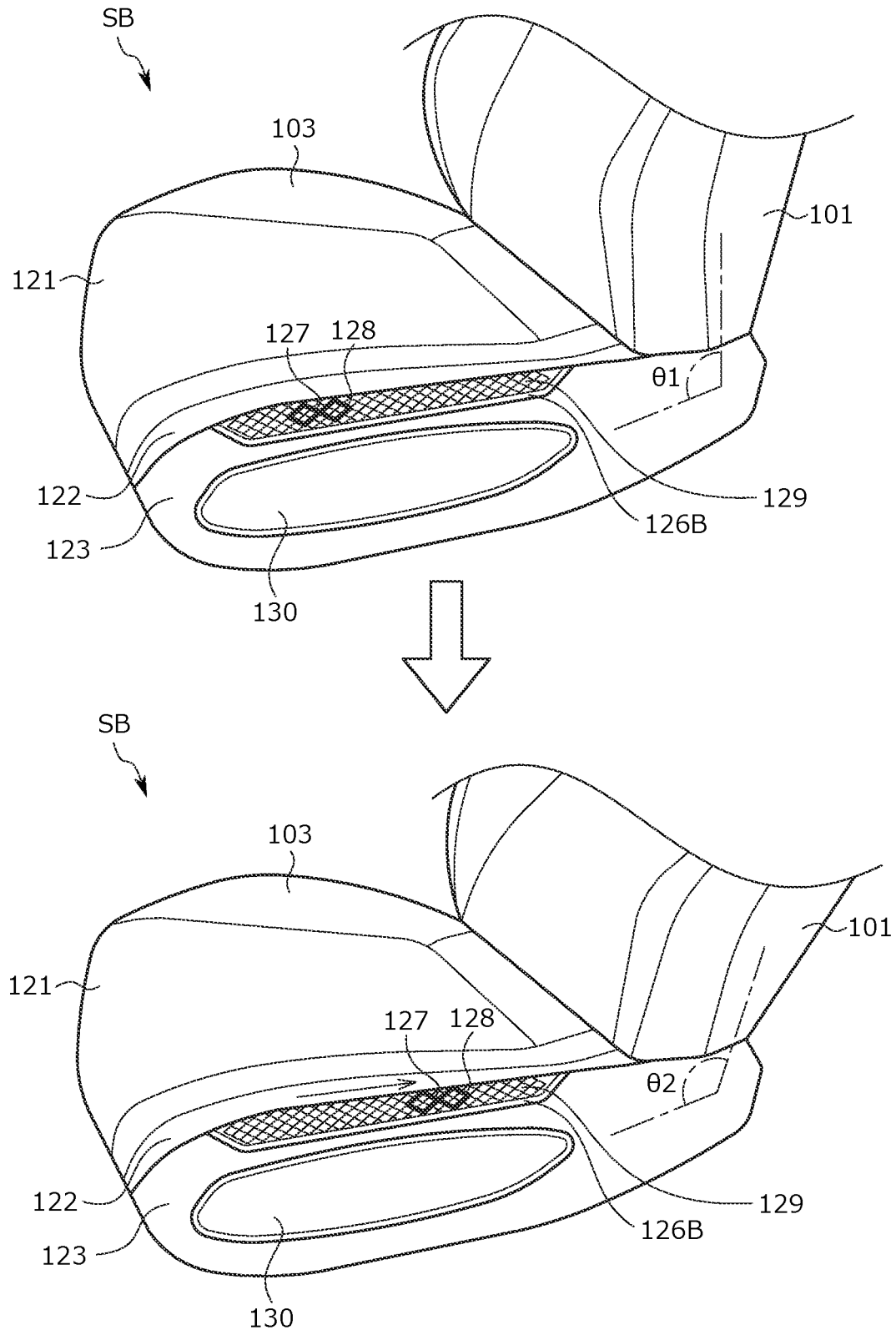
FIG. 13 is an explanatory diagram illustrating a touch switch with a movable sensing unit.

As in a conveyance seat SB illustrated in FIG. 13, a touch switch 126B that is long in the front to back direction may be provided and the positions to be the first sensing unit 127 and the second sensing unit 128 may be changeable on the touch switch 126B. The plurality of sensor regions 129 are arranged, and the sensor regions 129 to be the first sensing unit 127 and the second sensing unit 128 are selected by the control device 20. The positions of the first sensing unit 127 and the second sensing unit 128 may be changed based on the grip position detected by the grip position detection sensor 140. In addition, when the angle is changed by the reclining mechanism 107, the positions of the first sensing unit 127 and the second sensing unit 128 may be changed in accordance with an angle θ of the seat back 101 with respect to the seat cushion 102. For example, in a case where the posture of the seat back 101 becomes relaxed, that is, an angle θ2 has become larger than an angle θ1 suitable for normal traveling, the positions of the first sensing unit 127 and the second sensing unit 128 are moved rearward and disposed at positions that an occupant easily operates even in a relaxed posture.

<Rotatable Touch Switch 126C>

Figure 14:
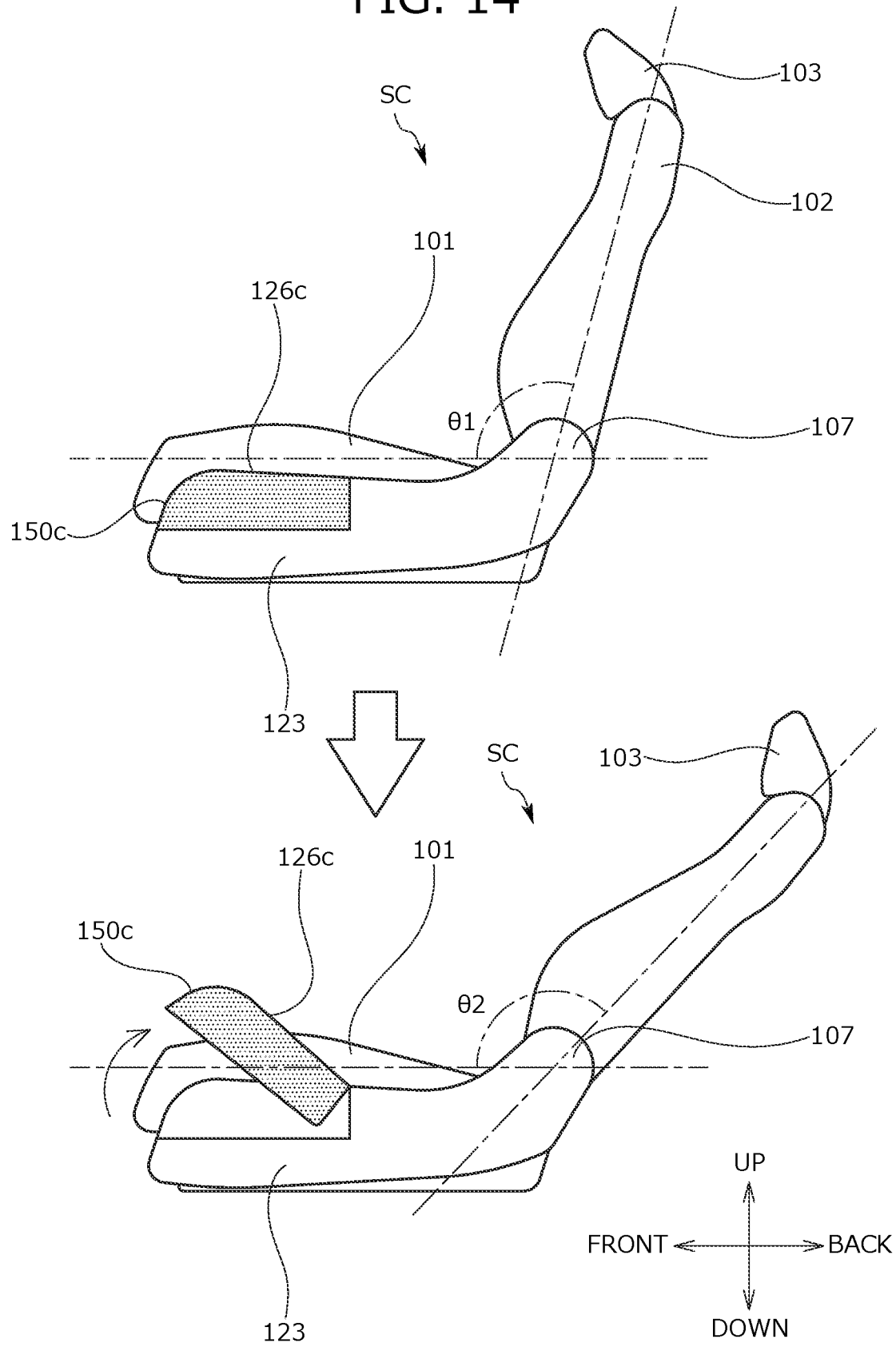
FIG. 14 is an explanatory diagram illustrating a vehicle seat in which the angle of an operating member where a touch switch is disposed with respect to a seat cushion can be changed.

In addition, as in a conveyance seat SC illustrated in FIG. 14, when the angle is changed by the reclining mechanism 107, the angle of a touch switch 126C with respect to the seat cushion 102 may be changed in accordance with the angle θ of the seat back 101 with respect to the seat cushion 102. In this case, an operating member 150C is rotatably provided on the side cover 123 and the touch switch 126C is provided on the upper surface of the operating member 150C. The angle of the operating member 150C with respect to the seat cushion 102 is changed by an electric motor. The inclination angle of the operating member 150C with respect to the seat cushion 102 may be changed manually.

<Detachable Touch Switch 126D>

Figure 15:
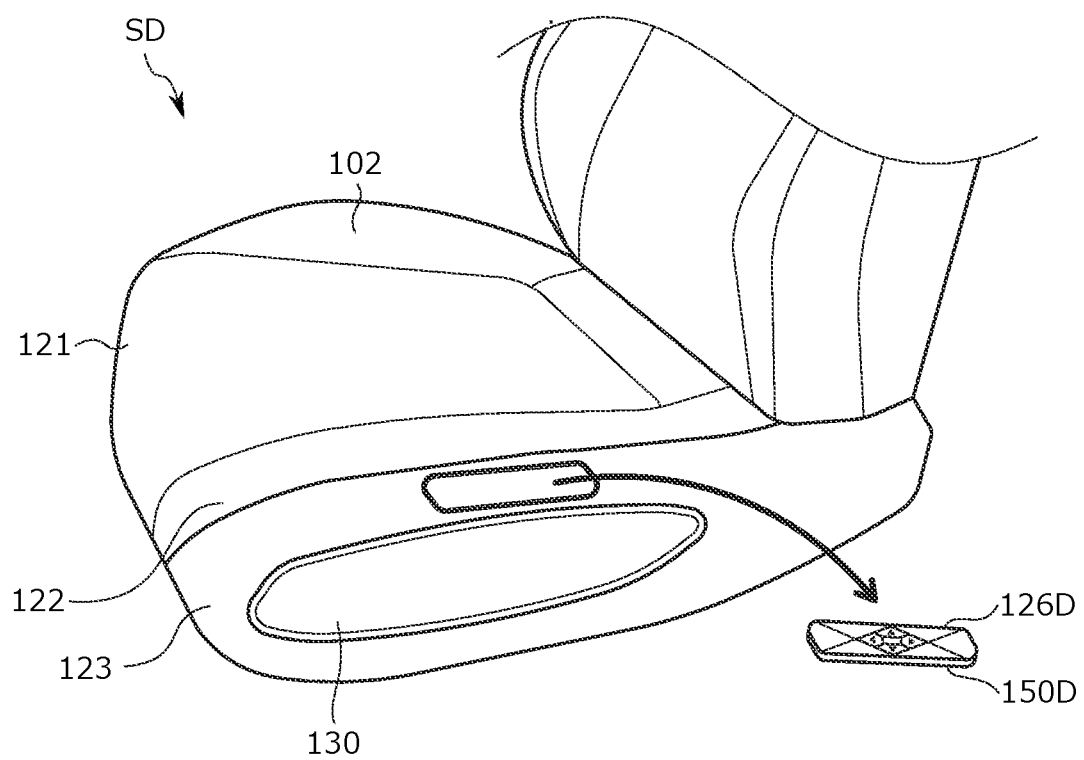
FIG. 15 is an explanatory diagram illustrating a vehicle seat including an operating member having a touch switch, which is detachably provided.

In addition, as in a conveyance seat SD illustrated in FIG. 15, an operating member 150D having a touch switch 126D may be provided to be detachable from the seat cushion 102.

The operating member 150D is equipped with a wireless communication device such as a Bluetooth (registered trademark) unit such that the touch switch 126D and the control device 20 are capable of wirelessly communicating with each other. In addition, it is preferable that the operating member 150D can be removed by being pulled out in the up to down direction with respect to the seat cushion 102. By limiting the removal direction to the up to down direction, inadvertently coming off the seat cushion 102 can be suppressed.

The seat cushion 102 (side cover 123) has a charging function and is capable of charging the operating member 150D. A charging terminal may be provided and, in addition, the charging may be performed by wireless power supply or the like.

It should be noted that the first sensing unit 127 and the second sensing unit 128 are disposed at positions that avoid the attachment portion of the operating member 150D, the charging terminal, or the like. As a result, an increase in thickness is suppressed and the operating member 150D can be made thinner.

In addition, the operating member 150D that is removed may be attachable to the armrest of the door or the armrest of the seat.

Figure 16A:
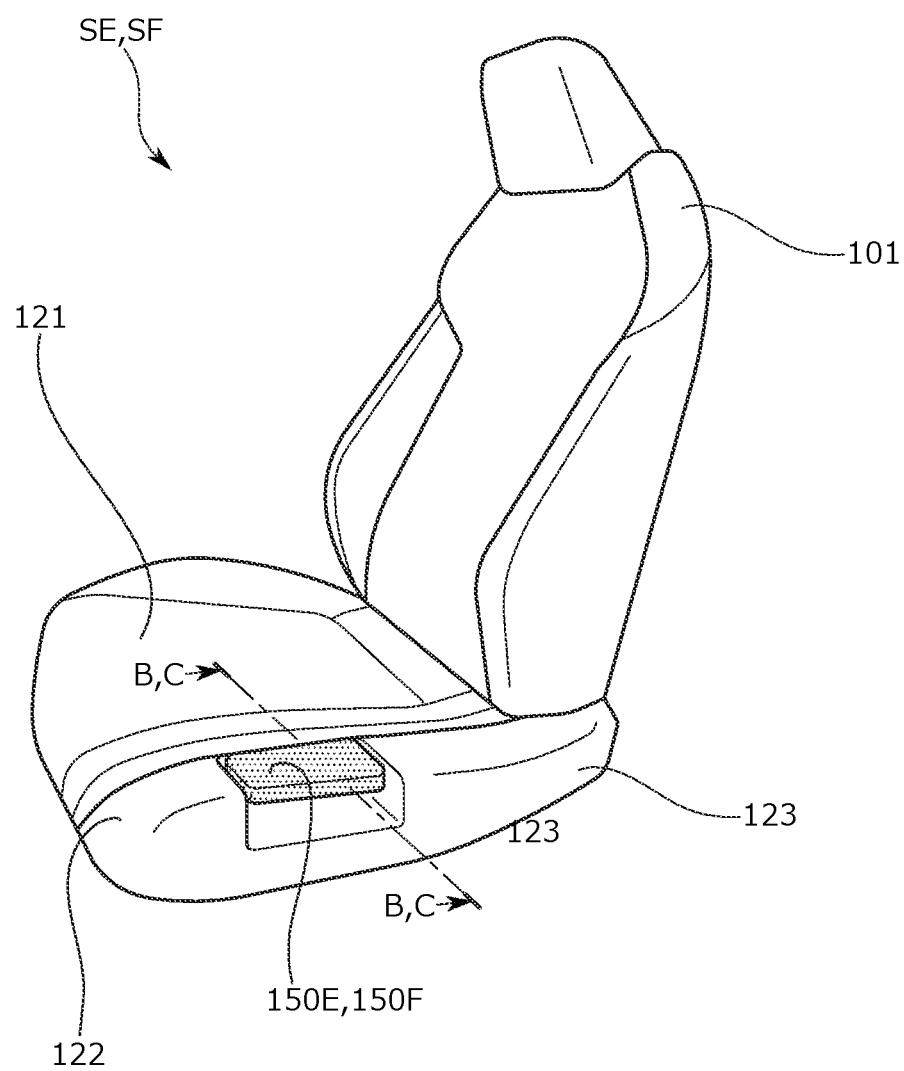
FIG. 16A is a perspective view of a vehicle seat including an operating member having a touch switch.
Figure 16B:
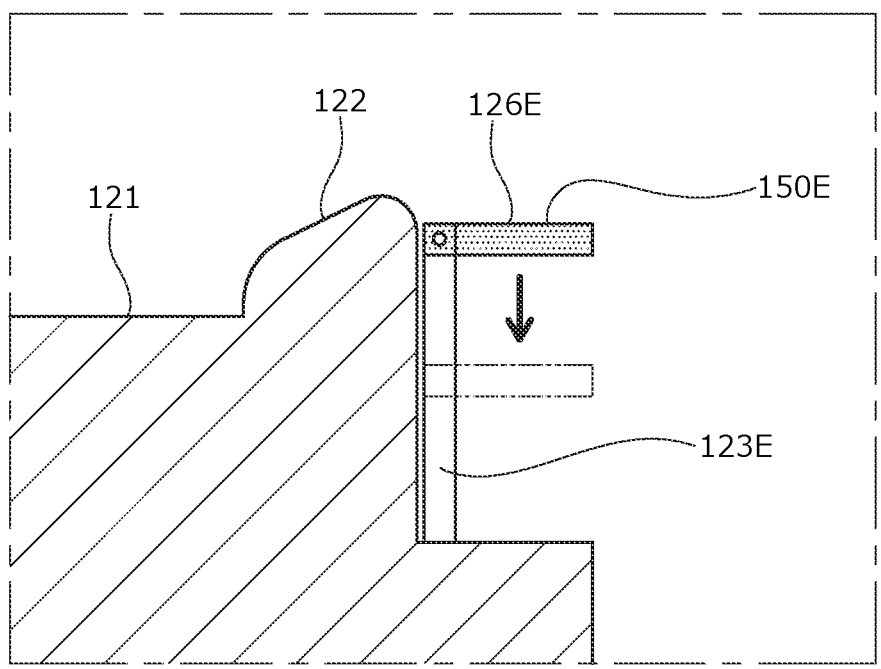
FIG. 16B is a cross-sectional view taken along line B-B of FIG. 16A and illustrates an operating member having a touch panel and attached so as to be movable in an up to down direction with respect to a seat cushion.

In addition, as in a conveyance seat SE illustrated in FIGS. 16A and 16B, an operating member 15E having a touch switch 126E on the upper surface thereof may be provided to be movable in the up to down direction.

Figure 16C:
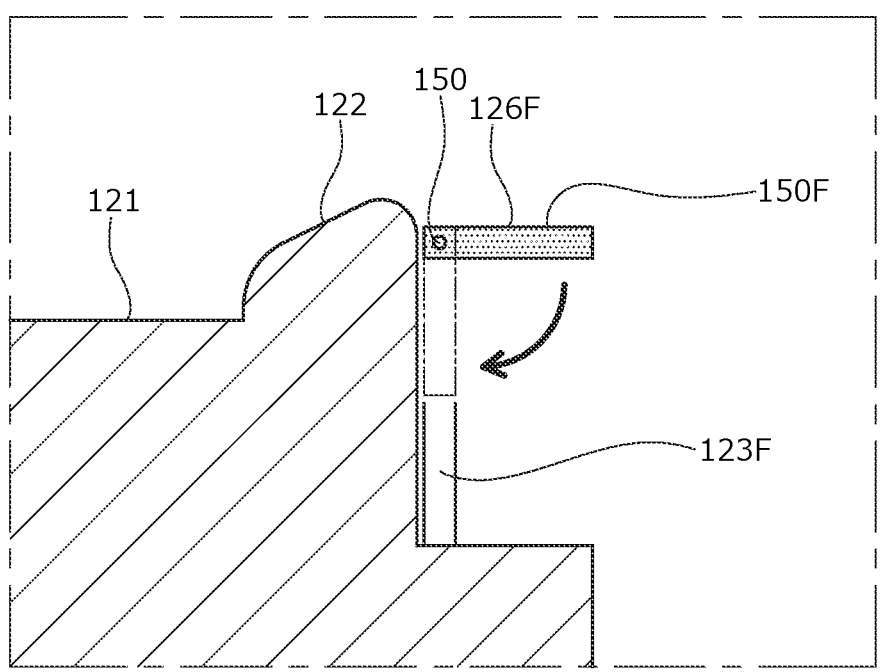
FIG. 16C is a cross-sectional view taken along line C-C of FIG. 16A and illustrates an operating member having a touch panel and attached so as to be rotatable with respect to a seat cushion.

In addition, as in a conveyance seat SF illustrated in FIGS. 16A and 16C, an operating member 15F having a touch switch 126F on the upper surface thereof may be rotatably provided so as to be foldable. By changing the position of the operating member 15E or folding the operating member 15F, it is possible to improve boarding and alighting without hindering a seated occupant boarding and alighting.

Other Embodiments

Figure 17:
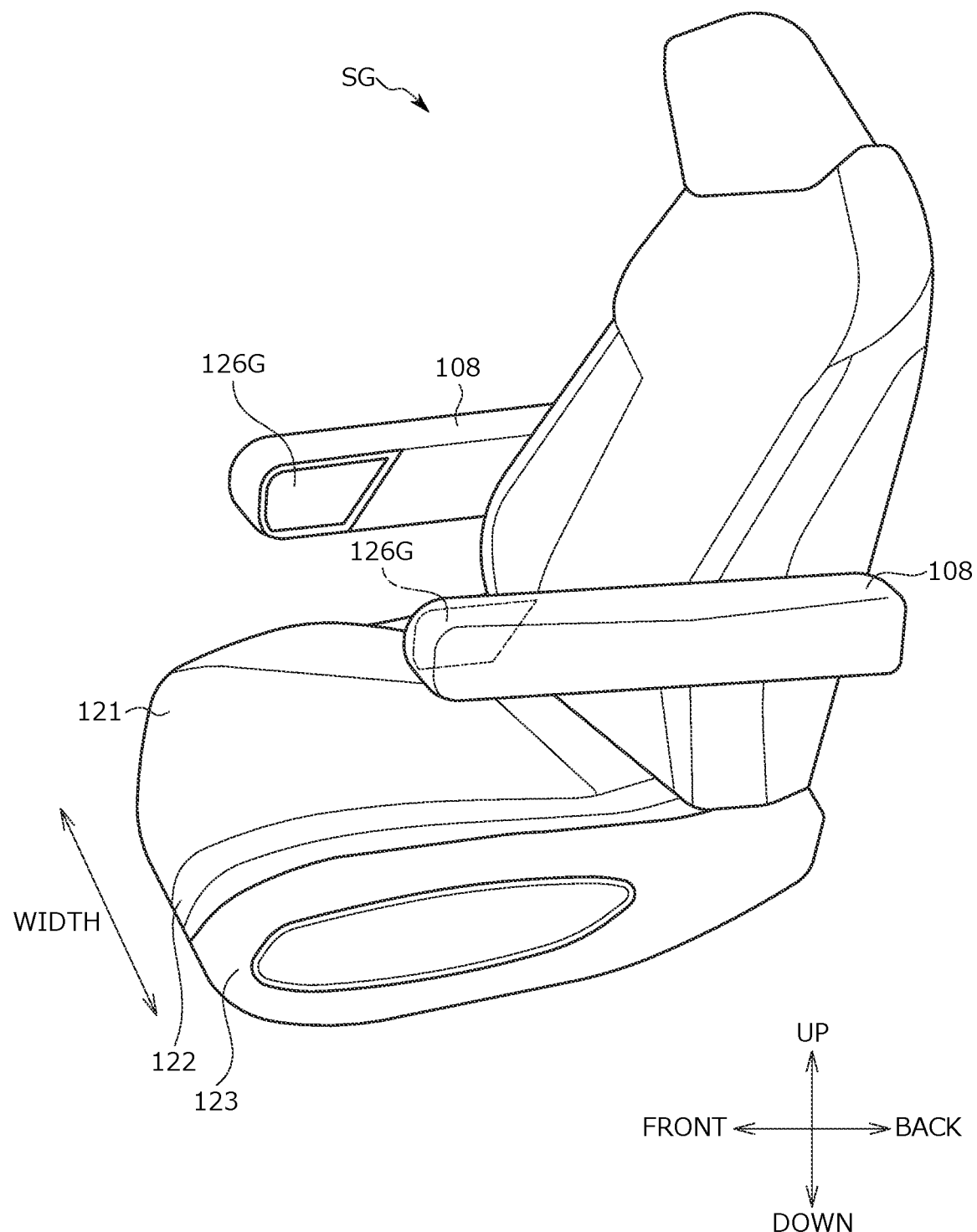
FIG. 17 is a perspective view illustrating a vehicle seat including a seat armrest having a touch switch.

As illustrated in FIG. 17, a touch switch 126G may be provided on an armrest 108 provided on the seat back 101 of a conveyance seat SG. The touch switch 126G is provided on the side surface of the armrest 108 on the inner side of the seat. By disposing the touch switch 126G on the side surface, it is possible to touch-operate the touch switch 126G with the thumb while gripping the tip of the armrest 108.

Figure 18A:
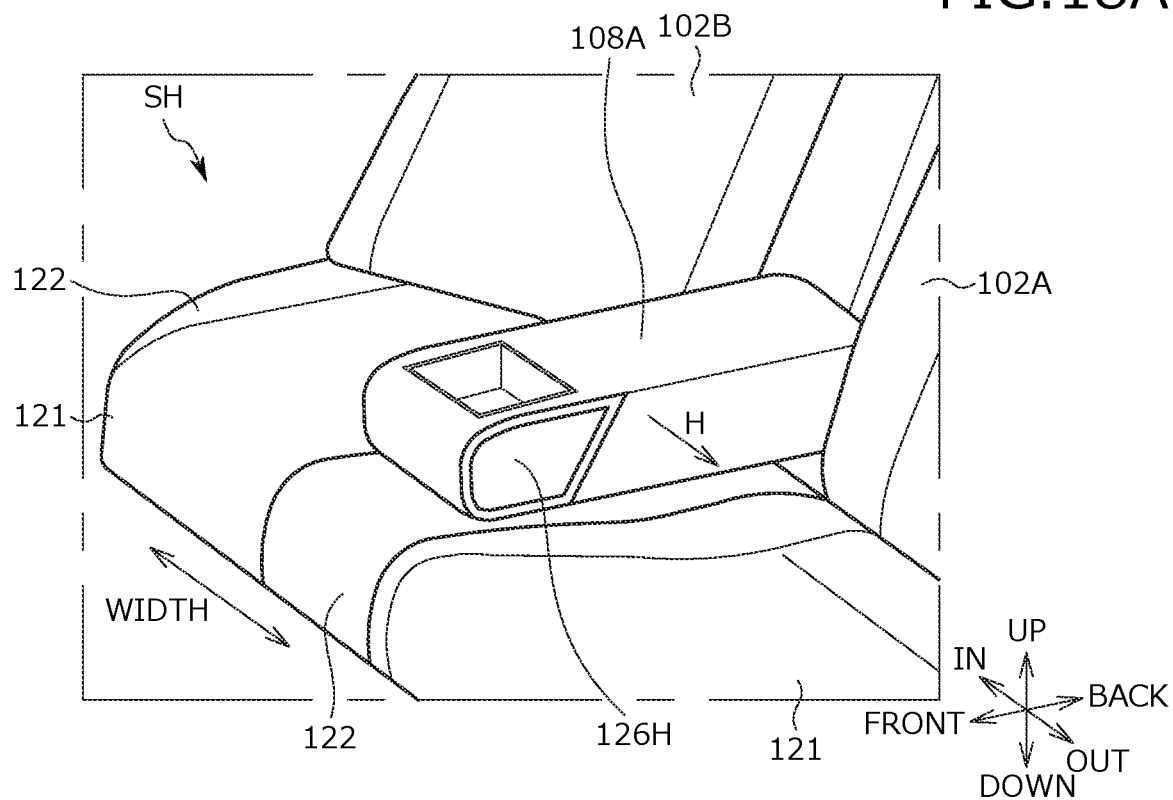
FIG. 18A is a perspective view illustrating a vehicle seat including a center armrest having a touch switch.

As in a vehicle seat SH illustrated in FIG. 18A, a touch switch 126H may be provided on a side surface of a center armrest 108A provided between a seat back 102A disposed on the left side of the rear seat and a seat back 102B disposed on the right side of the rear seat. By disposing the touch switch 126H on the side surface of the center armrest 108A, it is possible to touch-operate the touch switch 126H with the thumb while gripping the tip of the center armrest 108A.

Figure 18B:
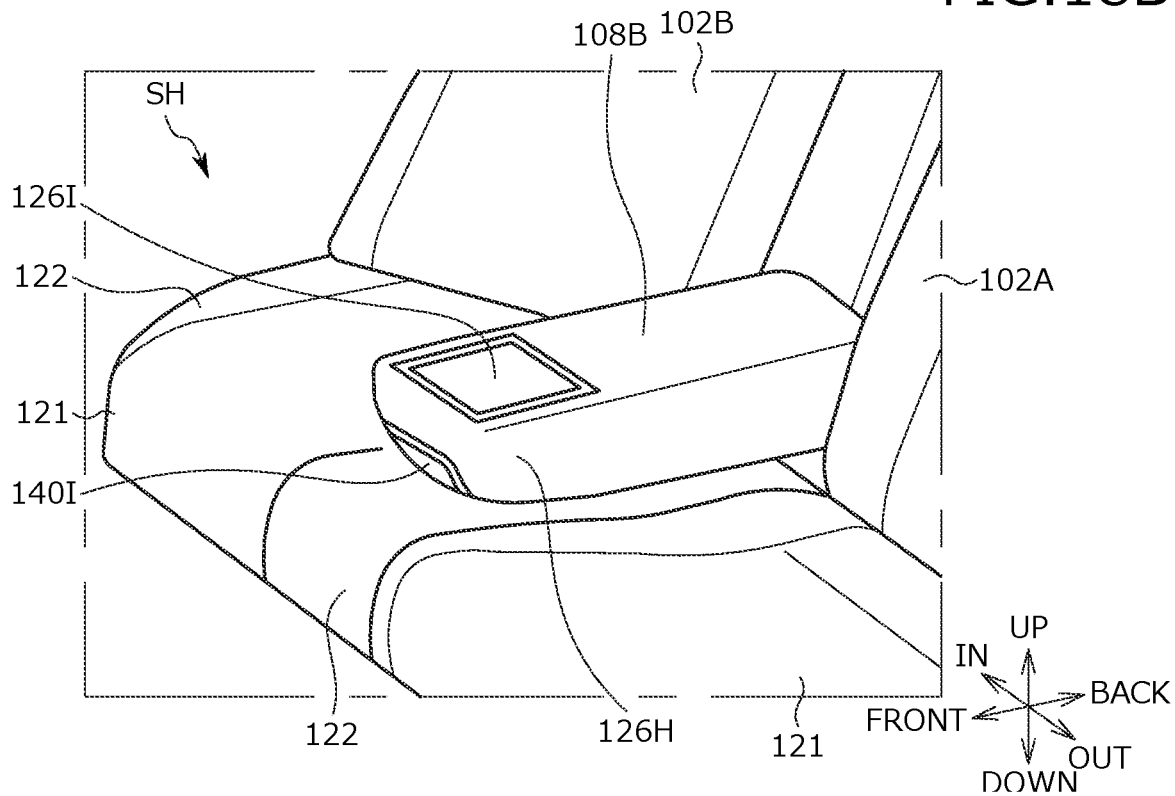
FIG. 18B is a perspective view illustrating a vehicle seat including a center armrest having a touch switch.

In addition, as in a vehicle seat SI illustrated in FIG. 18B, a touch switch 126I may be provided on the upper surface of a center armrest 108B. In a case where the touch switch 126I is provided on the upper surface, it is desirable to provide a grip detection sensor 141I at the tip part of the center armrest 108B. The touch switch 126I is made operable in a case where an occupant's finger is detected by the grip detection sensor 141I, that is, when the tip of the center armrest 108B is gripped by an occupant. By controlling the grip detection sensor 141I in this manner, an unintended misoperation can be suppressed.

Figure 19:
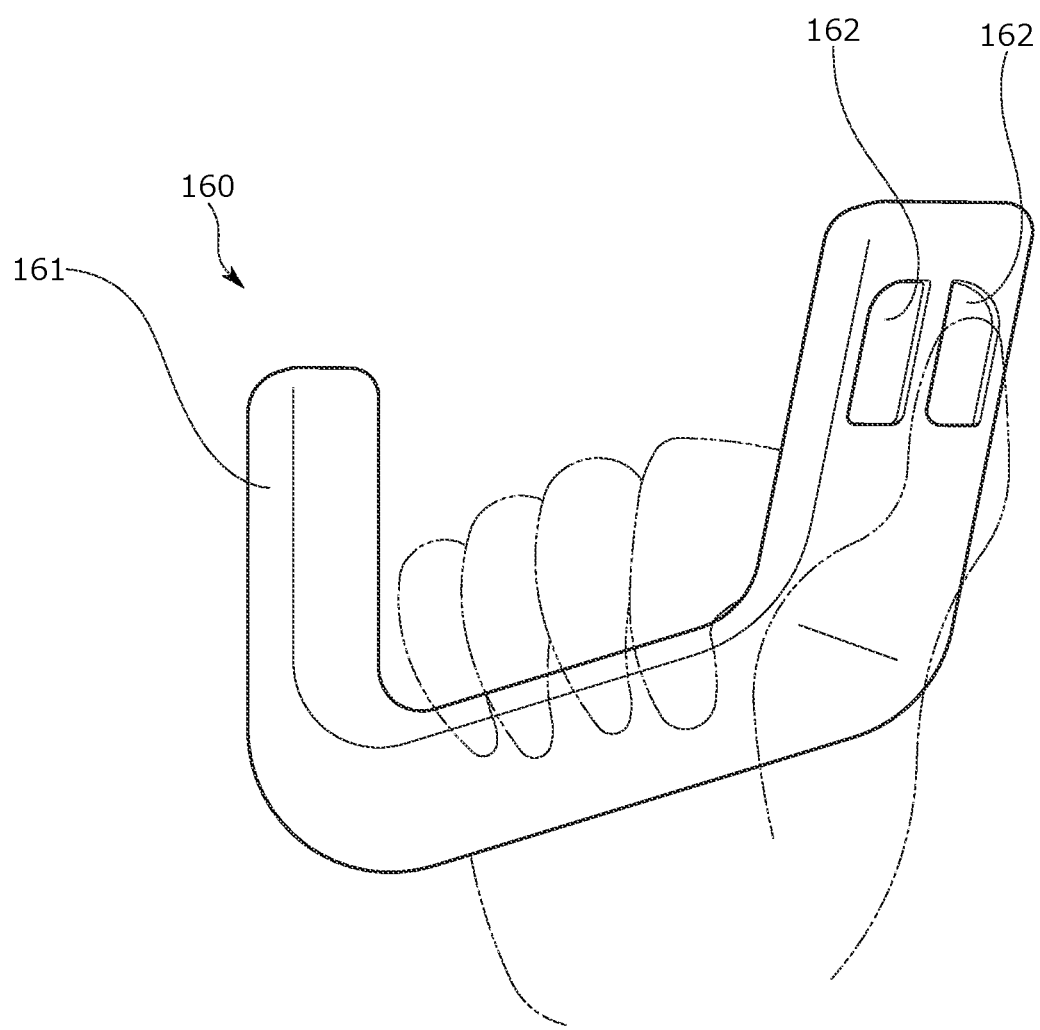
FIG. 19 is a perspective view illustrating a grip having a touch switch.

As illustrated in FIG. 19, a touch switch 162 may be provided on a grip 161 provided on a vehicular roof or B pillar. In a case where the touch switch 162 is provided on the grip 161, it is preferable to dispose the touch switch 162 at a position where the thumb abuts when the grip 161 is gripped.

In addition, it is desirable to lock the control of the touch switch 162 when the door is opened. In other words, it is desirable that the in-vehicle device 13 can be operated with the touch switch 162 only in a case where the door is closed.

Figure 20:
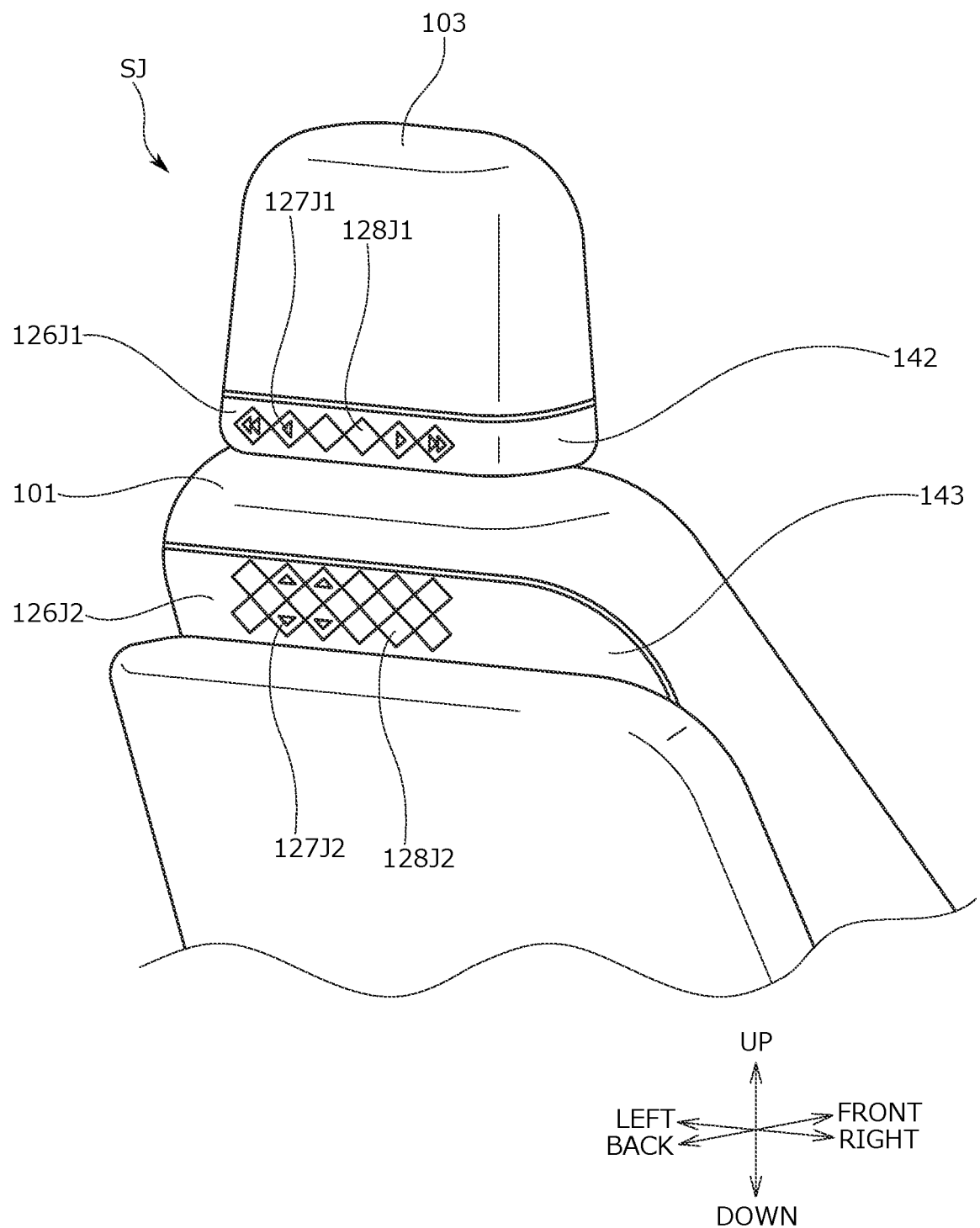
FIG. 20 is a perspective view illustrating a vehicle seat having touch switches on the back surface of a headrest and the back surface of a seat back.

As in a conveyance seat SJ illustrated in FIG. 20, a touch switch 126J1 may be provided on a texture 142 of the recess portion that is provided on the back surface of the headrest 103. The touch switch 126J1 is provided with a first sensing unit 127J1 and a second sensing unit 128J1. In addition, a touch switch 126J2 may be provided on a decorative panel 143 provided on the back surface of the seat back 101. The touch switch 126J2 is provided with a first sensing unit 127J2 and a second sensing unit 128J2. By providing the touch switches 126J1 and 126J2 on the back surface of the headrest 103 and the back surface of the seat back 101, an occupant seated in a rear seat can operate the in-vehicle device 13.

Figure 21A:
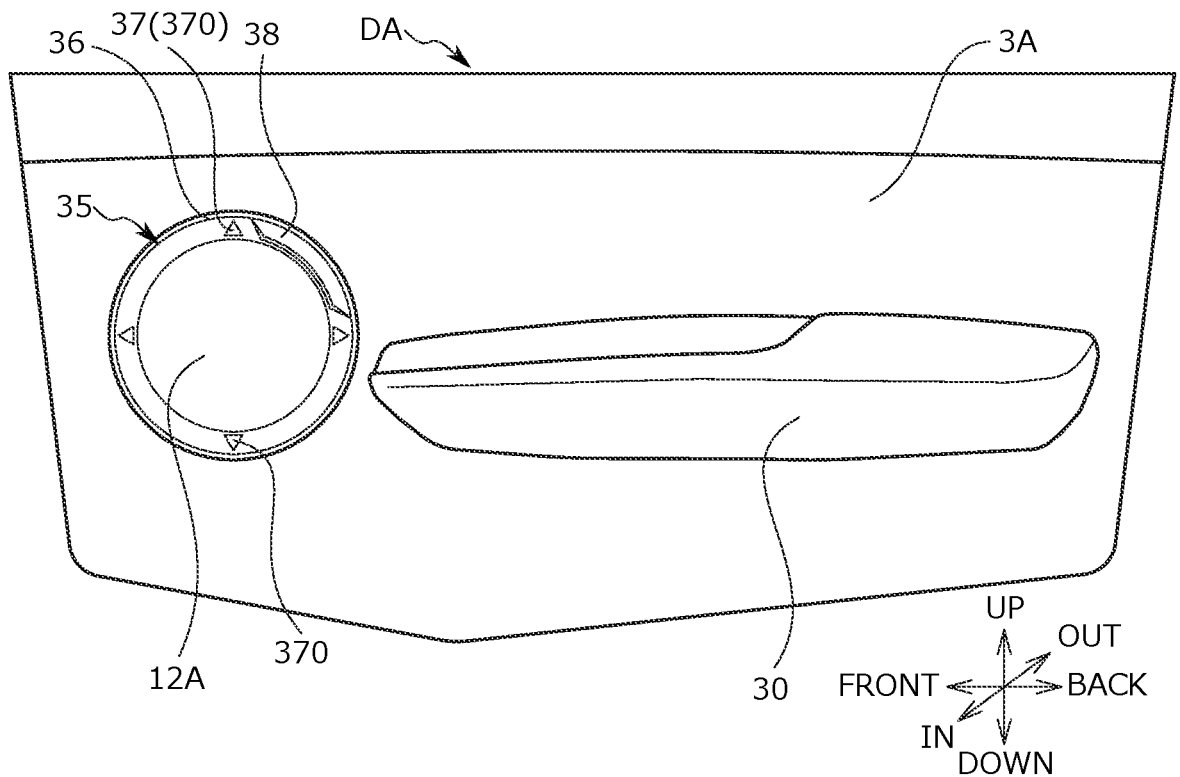
FIG. 21A is a diagram illustrating a door lining including a speaker having a touch switch therearound.

As in a door lining 3A of a door DA illustrated in FIG. 21A, a circular speaker 12A may be provided at the front part and the touch switch 35 may be provided around the circular speaker 12A. In this example, the first sensing units 37 of the touch switch are dispersed above, below, and to the right and left of the speaker 12A. The sound volume can be changed with the sensor regions 370 disposed above and below. For example, the sound volume increases when the sensor region 370 on the upper side is touched, and the sound volume decreases when the sensor region 370 on the lower side is touched. Setting may be performed such that touching the rear sensor region 370 leads to movement to the next song and touching the front sensor region 370 leads to movement to the previous song. In addition, rewind and fast forward operations may be enabled using the second sensing unit 38 disposed between the sensor regions 370 of the first sensing unit 37.

Figure 21B:
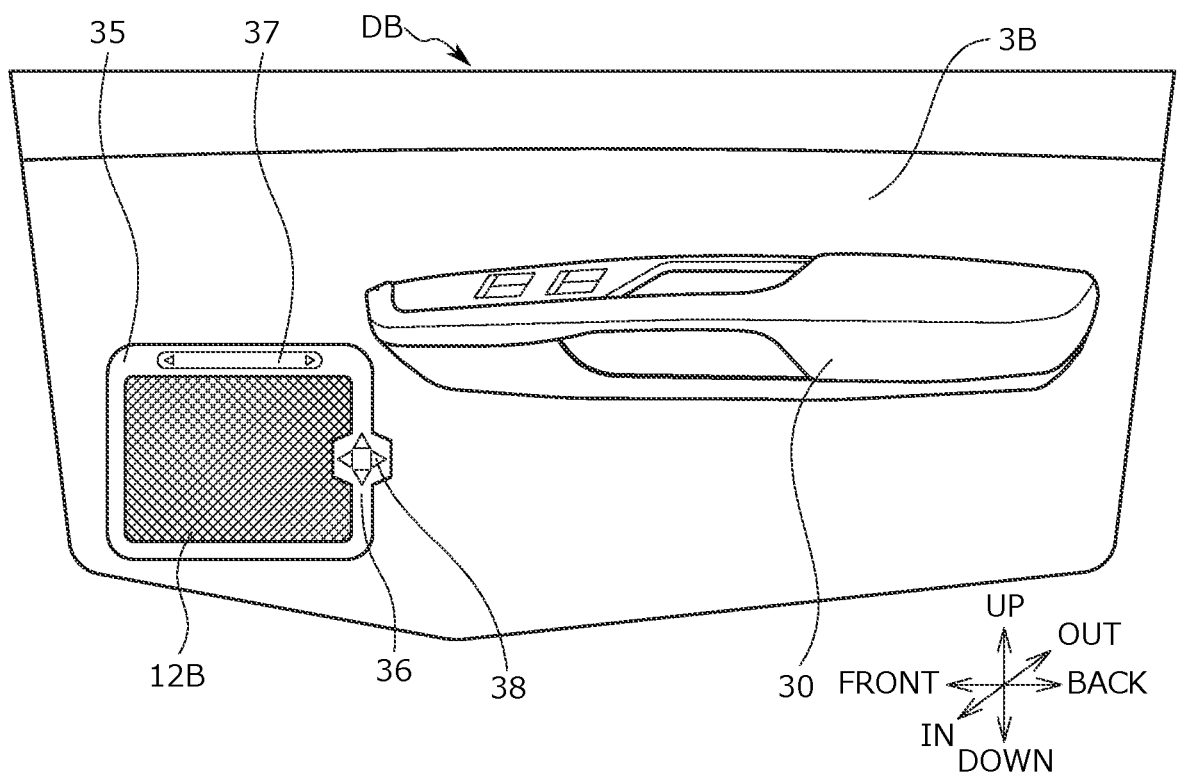
FIG. 21B is a diagram illustrating another example of the door lining including the speaker having the touch switch therearound.

As in a door lining 3B of a door DB illustrated in FIG. 21B, a quadrangular speaker 12B may be provided at the front part and the touch switch 35 may be provided around the quadrangular speaker 12B. In this example, the first sensing unit 37 of the touch switch is disposed on the upper side of the speaker 12B and the second sensing unit 38 is disposed on the rear side of the speaker as a cross key. The content of operation of the sensor region that is touched may be displayed on the display 19. By providing the touch switch 35 for operating the audio device 17 around the speaker, an occupant can operate the audio device 17 intuitively.

Appendices to the above second embodiment and other embodiments are as follows.

(Appendix 1)

A conveyance seat, comprising:
a seat cushion where an occupant sits; and
a touch switch operating an electrical component provided in a conveyance, wherein
the seat cushion includes
a seating portion formed as a seating surface in the occupant sitting, and
a bank portion disposed on an outer side portion of the seating portion in a seat width direction and protruding upward beyond the seating surface of the seating portion, and
the touch switch is disposed outside in the seat width direction in the bank portion.

(Appendix 2)

The conveyance seat according to appendix 1, wherein the touch switch is disposed at a position 100 mm behind a front end of the seat cushion.

(Appendix 3)

The conveyance seat according to appendix 1, wherein the touch switch is disposed below an upper end of the bank portion in the bank portion.

(Appendix 4)

The conveyance seat according to appendix 1, wherein
a recess portion recessed downward is formed outside in the seat width direction in the bank portion, and
the touch switch is disposed in the recess portion.

(Appendix 5)

The conveyance seat according to appendix 1, wherein
the seat cushion includes a seat cushion frame forming a skeleton of the seat cushion, a pad portion covering the seat cushion frame, and a skin material covering the pad portion, and
the touch switch is connected to the skin material and disposed on a surface side of the skin material.

(Appendix 6)

The conveyance seat according to appendix 1, wherein
the seat cushion includes:
a seat cushion frame forming a skeleton of the seat cushion; and
a side cover portion covering the seat cushion frame outside in the seat width direction, and
the touch switch is disposed on an upper surface of the side cover portion.

(Appendix 7)

The conveyance seat according to appendix 6, wherein
a recess portion recessed inward in the seat width direction is formed in a side portion of the side cover portion outside in the seat width direction, and
the touch switch is disposed above the recess portion.

(Appendix 8)

The conveyance seat according to appendix 1, comprising a seating detection sensor detecting that the occupant is seated on the seat cushion,
wherein the touch switch enables the electrical component to be operated by the touch switch in a case where the seating of the occupant is detected by the seating detection sensor.

(Appendix 9)

The conveyance seat according to appendix 1, wherein
the touch switch is capable of acquiring information on a state of the conveyance seat, and
the touch switch enables the electrical component to be operated by the touch switch in a case where information that the conveyance seat is in a relaxed state to relax the occupant is acquired.

(Appendix 10)

The conveyance seat according to appendix 1, wherein the touch switch enables the electrical component to be operated by the touch switch in a case where the conveyance is in an autonomous traveling state.

(Appendix 11)

The conveyance seat according to appendix 1, comprising a seat back and a reclining mechanism capable of adjusting an angle of the seat back with respect to the seat cushion, wherein
- a part where the touch switch is disposed is provided such that an angle with respect to the seat cushion is changeable, and
- the angle of the part where the touch switch is disposed with respect to the seat cushion is changed in accordance with the angle of the seat back.

(Appendix 12)

The conveyance seat according to appendix 1, wherein the touch switch has a sensor surface with which the occupant's finger comes into contact and a sensing unit detecting the occupant's finger on the sensor surface, and
a position or range of the sensing unit detecting the occupant's finger is configured to be changeable on the sensor surface.

(Appendix 13)

The conveyance seat according to appendix 1, comprising an operating member attached so as to be movable upward and downward or rotatable with respect to the seat cushion and provided with the touch switch in a side portion of the seat cushion outside in the seat width direction.

(Appendix 14)

The conveyance seat according to appendix 1, comprising an operating member having the touch switch and attached so as to be detachable with respect to the seat cushion, wherein
- the touch switch operates the electrical equipment by wireless communication, and
- the operating member is removed by being pulled out in an up to down direction with respect to the seat cushion.

(Appendix 15)

A conveyance seat, comprising:
- a seat back;
- an armrest provided on a side portion of the seat back on an outer side in a seat width direction; and
- a touch switch provided on a side surface positioned inside the seat and outside the armrest in the seat width direction.

(Appendix 16)

A conveyance seat, comprising:
- a right seat back disposed on a right side;
- a left seat back disposed on a left side;
- a center armrest positioned between the right seat back and the left seat back; and
- a touch switch disposed on an outer side surface of the center armrest in a seat width direction or an upper surface of the center armrest in a state where the center armrest is laid down forward.

(Appendix 17)

An interior article for a conveyance, comprising:
- a grip provided on a roof or a B pillar; and
- a touch switch provided on the grip and operating an electrical component provided in a conveyance,
- wherein the touch switch enables the electrical component to be operated by the touch switch in a case where a door of the conveyance is closed.

(Appendix 18)

An interior article for a conveyance, comprising:
- a speaker provided in a door of a conveyance; and
- a touch switch provided around the speaker and operating an electrical component provided in the conveyance.

REFERENCE SIGNS LIST

D: vehicle door
P: door panel
1: door lining
2: window
5: upper member
6: center member
7: lower member
11: door handle
12: speaker
13: in-vehicle device (electrical component)
14: power window device
15: electric seat device
15a: front to back adjustment mechanism
15b: height adjustment mechanism
15c: reclining mechanism
15d: seat heater
16: car navigation device
17: audio device
18: air conditioning device
19: display
20: control device
30, 30B, 30C, 30D: door armrest
   30a: door armrest main body
31: door window opening-closing switch
32: pull pocket
33: recess portion
33a: opening portion
33b: bottom portion
33c: standing wall portion
33d: curved surface
35: touch switch
36, 36A: sensing unit
37, 37A: first sensing unit
   370: sensor region
   371: upper sensor region
   372: lower sensor region
   373: display unit
38, 38A: second sensing unit
   380: sensor region
   381: upper sensor region
   382: lower sensor region
   383: display unit
40: grip detection sensor
41: hand detection sensor
50A, 50B: operating member
S: vehicle seat (conveyance seat)
F: seat frame
T: cushion trim cover
Pa: pad
101: seat back
102: seat cushion
103: headrest
104: slide rail
107: reclining mechanism
108: armrest
110: seat back frame
111: back side frame
112: upper frame
113: lower frame
115: seat cushion frame
116: cushion side frame
117: front connection frame
118: rear connection frame
119: cushion pan frame
121: seating portion 122: bank portion
123: side cover
124: decorative frame member
125: recess portion
126: touch switch
127: first sensing unit
128: second sensing unit
129: sensor region
130: recessed part
140: grip position detection sensor
141: grip detection sensor
142: texture
143: decorative panel
150A to 150F: operating member
161: grip
162: touch switch

The invention claimed is:

1. An interior article for a conveyance, comprising:
a touch switch operating an electrical component provided in the conveyance;
a recess portion formed in a side surface on an interior side of the conveyance; and
a grip portion provided near the touch switch and gripped when an occupant operates the touch switch,
wherein
the touch switch has a sensor detecting a finger of the occupant,
the recess portion has an opening portion, a bottom portion, a standing wall portion formed around the bottom portion, and a curved surface formed in the bottom portion that is curved so as to protrude toward the opening portion,
the sensor is disposed on the curved surface,
the grip portion has a grip detector detecting gripping performed by the occupant and a grip position detector detecting a position gripped by the occupant in the grip portion, and
the touch switch changes a position of the sensor detecting the occupant's finger in the touch switch based on the grip position of the occupant detected by the grip position detector.

2. The interior article for a conveyance according to claim 1, wherein the interior article for a conveyance is a door lining provided on a conveyance door, and the recess portion is formed on a side surface of the door lining on the interior side.

3. The interior article for a conveyance according to claim 1, wherein the sensor is configured from a plurality of sensor regions arranged in an up to down direction of the conveyance, and the sensor region positioned on a lower side is disposed so as to deviate from an axis in the up to down direction of the sensor region positioned on an upper side.

4. The interior article for a conveyance according to claim 1, wherein
the sensor is configured from a plurality of sensor regions arranged in an up to down direction and a front to back direction of the conveyance, and
as for a lower sensor region positioned on a lower side, a front end portion of the lower sensor region is positioned behind a front end portion of the upper sensor region positioned on an upper side, or a rear end portion of the lower sensor region is positioned behind a rear end portion of the upper sensor region.

5. The interior article for a conveyance according to claim 1, wherein
the sensor comprises a first sensor configured from a plurality of sensor regions arranged in an up to down direction of the conveyance, and a second sensor disposed behind the first sensor in a front to back direction of the conveyance and configured from a plurality of sensor regions arranged in the up to down direction of the conveyance, and
a lowermost sensor region of the first sensor and an uppermost sensor region of the second sensor are disposed so as to overlap in the up to down direction.

6. The interior article for a conveyance according to claim 1, wherein
the operation of the electrical component by the touch switch is enabled in a case where the gripping of the grip portion is detected by the grip detector.

7. The interior article for a conveyance according to claim 1, wherein
the touch switch is capable of receiving information indicating a state of a conveyance seat where the occupant sits from a controller that controls the conveyance seat, and
the operation of the electrical component by the touch switch is enabled in a case where the touch switch receives information indicating that the conveyance seat is in a relaxed state to relax the occupant from the controller.

8. The interior article for a conveyance according to claim 1, wherein the touch switch enables the operation of the electrical component by the touch switch in a case where the conveyance is in an autonomous traveling state.

9. The interior article for a conveyance according to claim 1, wherein
a plurality of the sensors are provided, and at least one of the plurality of sensors is a target selection sensor selecting the electrical component to be operated by the touch switch, and
the target selection sensor enables the electrical component to be operated to be changed in a case where the target selection sensor is long-pressed for a predetermined time by the occupant.

10. The interior article for a conveyance according to claim 1, comprising a main body and an operating member having the touch switch and detachably attached to the main body, wherein
the touch switch operates the electrical component by wireless communication, and
the operating member is removed by being pulled out in an up to down direction with respect to the main body of the interior article for a conveyance.

11. The interior article for a conveyance according to claim 1, comprising a main body and an operating member having the touch switch and rotatably attached to the main body.

12. An interior article for a conveyance, comprising:
a touch switch operating an electrical component provided in the conveyance;
a recess portion formed in a side surface on an interior side of an conveyance; and
a grip portion provided near the touch switch and gripped when the occupant operates the touch switch,
wherein
the touch switch has a sensor detecting a finger of the occupant,
the recess portion has an opening portion, a bottom portion, a standing wall portion formed around the bottom portion, and a curved surface formed in the bottom portion that is curved so as to protrude toward the opening portion, the sensor is disposed on the curved surface, the grip portion has a grip detector detecting gripping performed by the occupant, and the operation of the electrical component by the touch switch is enabled in a case where the gripping of the grip portion is detected by the grip detector.

13. A method for manufacturing an interior article for a conveyance comprising:

preparing the interior article for the conveyance, wherein a recess portion is formed in a side surface on an interior side of the conveyance and the recess portion has an opening portion, a bottom portion, a standing wall portion formed around the bottom portion, and a curved surface formed in the bottom portion that is curved so as to protrude toward the opening portion;

providing a touch switch operating an electrical component provided on the conveyance to the interior article;

providing a grip portion near the touch switch that is gripped when an occupant operates the touch switch and has a grip detector detecting gripping performed by the occupant; and disposing a sensor on the curved surface, wherein the operation of the electrical component by the touch switch is enabled in a case where the gripping of the grip portion is detected by the grip detector.

* * * * *